US012701991B2

(12) United States Patent     (10) Patent No.:    US 12,701,991 B2

Williams et al.     (45) Date of Patent:    Aug. 4, 2026

(54) INTEGRATED ISOLATION CAPACITOR WITH ENHANCED BOTTOM PLATE

(71) Applicant: Texas Instruments Incorporated, Dallas, TX (US)

(72) Inventors: Byron Lovell Williams, Plano, TX (US); Elizabeth Costner Stewart, Dallas, TX (US); Jeffrey Alan West, Dallas, TX (US); Thomas Dyer Bonifield, Dallas, TX (US)

(73) Assignee: TEXAS INSTRUMENTS INCORPORATED, Dallas, TX (US)

( * ) Notice:     Subject to any disclaimer, the term of this patent is extended or adjusted under 35 U.S.C. 154(b) by 729 days.

(21) Appl. No.: 17/682,762

(22) Filed:     Feb. 28, 2022

(65)     Prior Publication Data

US 2023/0056046 A1     Feb. 23, 2023

Related U.S. Application Data

(60) Provisional application No. 63/234,388, filed on Aug. 18, 2021.

(51) Int. Cl.
H10W 20/40     (2026.01)
H10W 20/00     (2026.01)
(Continued)

(52) U.S. Cl.
CPC ....... H10W 20/496 (2026.01); H10W 20/081 (2026.01); H10W 20/423 (2026.01);
(Continued)

(58) Field of Classification Search
CPC ............. H01L 23/5223; H01L 23/5225; H01L 23/49575; H01L 2224/48245; H01L 24/49;
(Continued)

(56)     References Cited

U.S. PATENT DOCUMENTS 6,441,419 B1     8/2002   Johnson et al.
6,841,455 B2     1/2005   West et al.
(Continued)

FOREIGN PATENT DOCUMENTS

DE     102012109164 A1     3/2013
DE     102020133922 A1     7/2021
JP       2013191764 A     9/2013

OTHER PUBLICATIONS

DE Office Action dated Jul. 25, 2023.
English-language machine translation of DE Office Action dated Jul. 25, 2023.

*Primary Examiner* — Jacob Y Choi
*Assistant Examiner* — Ashley Nicole Blackwell
(74) *Attorney, Agent, or Firm* — Andrew R. Ralston; Frank D. Cimino

(57)     ABSTRACT

An electronic device has a conductive shield between first and second regions in a multilevel metallization structure, as well as a capacitor with first and second terminals in the first region, the first terminal laterally overlaps the second terminal by an overlap distance of 1.0 μm to 6.0 μm, the conductive shield includes a first metal line that encircles the first terminal, and the first metal line is spaced apart from the first terminal by a gap distance of 0.5 μm to 1.0 μm.

24 Claims, 28 Drawing Sheets

(51) Int. Cl.

| | |
|---|---|
| *H10W 20/41* | (2026.01) |
| *H10W 20/43* | (2026.01) |
| *H10D 88/00* | (2025.01) |
| *H10W 20/47* | (2026.01) |
| *H10W 72/90* | (2026.01) |
| *H10W 90/00* | (2026.01) |

(52) U.S. Cl.
CPC ............ *H10W 20/43* (2026.01); *H10D 88/00* (2025.01); *H10W 20/063* (2026.01); *H10W 20/47* (2026.01); *H10W 72/90* (2026.01); *H10W 72/941* (2026.01); *H10W 90/753* (2026.01); *H10W 90/756* (2026.01); *H10W 90/811* (2026.01)

(58) Field of Classification Search
CPC . H01L 2224/04042; H01L 2224/48247; H01L 2224/48463; H01L 21/76802; H01L 23/528; H01L 21/76885; H01L 23/53295; H01L 24/05; H01L 24/48; H01L 2224/0556; H01L 2224/05573; H01L 2224/48137; H01L 24/03; H01L 2224/49171; H01L 2924/00014; H01L 2924/181; H01L 23/49562; H10D 88/00; H10W 20/496; H10W 20/081; H10W 20/423; H10W 20/43; H10W 20/063; H10W 20/47; H10W 72/90; H10W 72/941; H10W 90/753; H10W 90/756; H10W 90/811; H10W 72/536; H10W 72/5449; H10W 72/59; H10W 74/00; H10W 72/019; H10W 70/481
See application file for complete search history.

(56) References Cited

U.S. PATENT DOCUMENTS

| | | | |
|---|---|---|---|
| 9,299,697 | B2 | 3/2016 | West et al. |
| 9,583,558 | B2 | 2/2017 | West et al. |
| 10,147,784 | B2 | 12/2018 | West et al. |
| 2005/0026356 | A1 | 2/2005 | Kim |
| 2009/0322447 | A1 | 12/2009 | Daley et al. |
| 2011/0031581 | A1 | 2/2011 | West |
| 2011/0227227 | A1 | 9/2011 | West |
| 2014/0183698 | A1 | 7/2014 | Hsu et al. |
| 2014/0264740 | A1 | 9/2014 | Stribley |
| 2015/0069572 | A1 | 3/2015 | Khanolkar et al. |
| 2015/0333055 | A1* | 11/2015 | West ...................... H01L 28/91 257/306 |
| 2018/0162722 | A1* | 6/2018 | Male .................... B81B 7/0048 |
| 2019/0148486 | A1 | 5/2019 | Selvaraj |
| 2020/0030285 | A1 | 1/2020 | Klotsman |
| 2020/0168534 | A1 | 5/2020 | Bonifield et al. |
| 2020/0235067 | A1* | 7/2020 | Kim ......................... H01L 24/81 |
| 2020/0303285 | A1* | 9/2020 | Dadvand ............. H01L 25/0655 |
| 2020/0303319 | A1 | 9/2020 | Khanolkar et al. |
| 2021/0233700 | A1 | 7/2021 | Osada et al. |
| 2021/0305178 | A1 | 9/2021 | West |

* cited by examiner

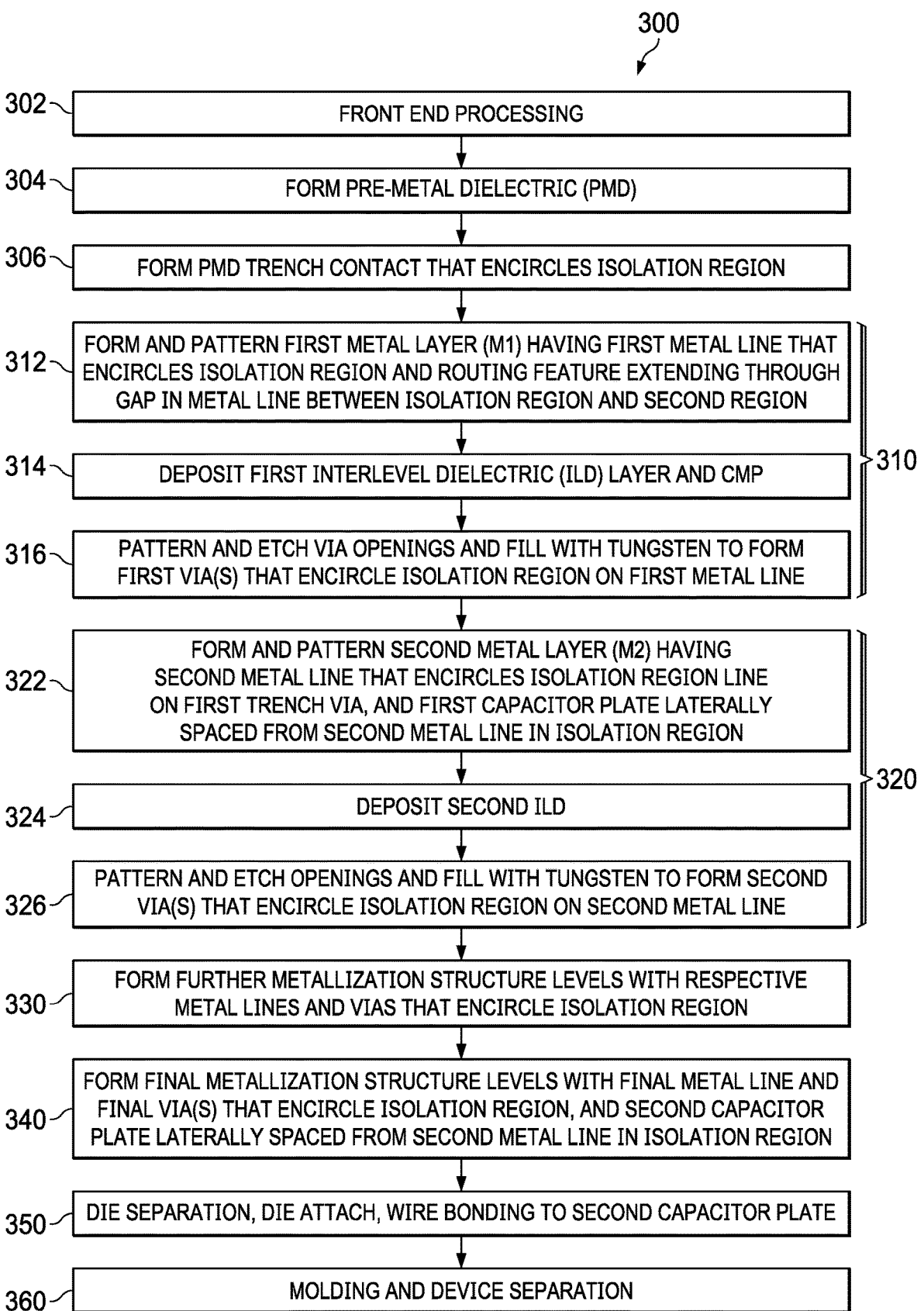

300

302 — FRONT END PROCESSING

304 — FORM PRE-METAL DIELECTRIC (PMD)

306 — FORM PMD TRENCH CONTACT THAT ENCIRCLES ISOLATION REGION

312 — FORM AND PATTERN FIRST METAL LAYER (M1) HAVING FIRST METAL LINE THAT ENCIRCLES ISOLATION REGION AND ROUTING FEATURE EXTENDING THROUGH GAP IN METAL LINE BETWEEN ISOLATION REGION AND SECOND REGION

314 — DEPOSIT FIRST INTERLEVEL DIELECTRIC (ILD) LAYER AND CMP

316 — PATTERN AND ETCH VIA OPENINGS AND FILL WITH TUNGSTEN TO FORM FIRST VIA(S) THAT ENCIRCLE ISOLATION REGION ON FIRST METAL LINE

310

322 — FORM AND PATTERN SECOND METAL LAYER (M2) HAVING SECOND METAL LINE THAT ENCIRCLES ISOLATION REGION LINE ON FIRST TRENCH VIA, AND FIRST CAPACITOR PLATE LATERALLY SPACED FROM SECOND METAL LINE IN ISOLATION REGION

324 — DEPOSIT SECOND ILD

326 — PATTERN AND ETCH OPENINGS AND FILL WITH TUNGSTEN TO FORM SECOND VIA(S) THAT ENCIRCLE ISOLATION REGION ON SECOND METAL LINE

320

330 — FORM FURTHER METALLIZATION STRUCTURE LEVELS WITH RESPECTIVE METAL LINES AND VIAS THAT ENCIRCLE ISOLATION REGION

340 — FORM FINAL METALLIZATION STRUCTURE LEVELS WITH FINAL METAL LINE AND FINAL VIA(S) THAT ENCIRCLE ISOLATION REGION, AND SECOND CAPACITOR PLATE LATERALLY SPACED FROM SECOND METAL LINE IN ISOLATION REGION

350 — DIE SEPARATION, DIE ATTACH, WIRE BONDING TO SECOND CAPACITOR PLATE

360 — MOLDING AND DEVICE SEPARATION

FIG. 3

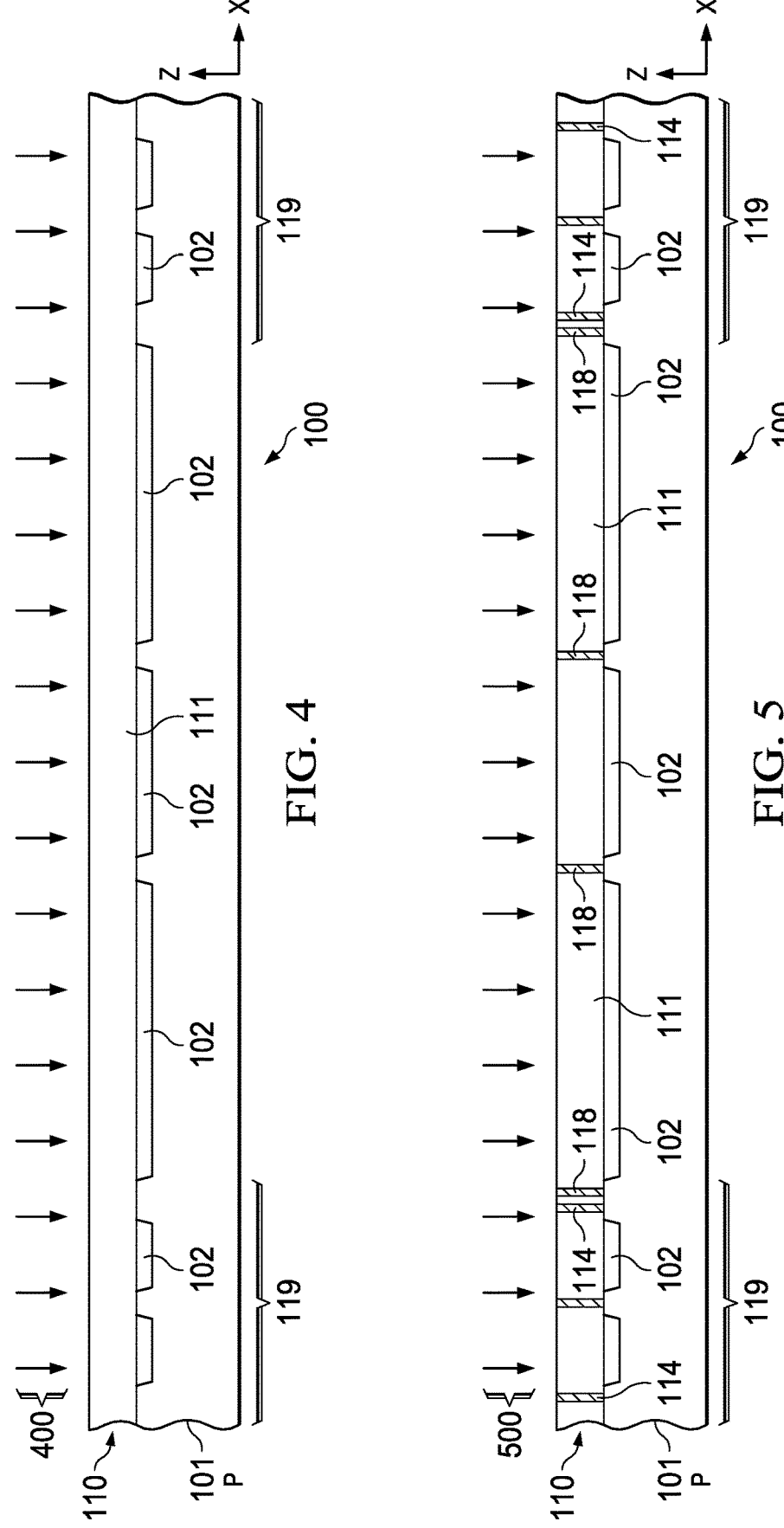

INTEGRATED ISOLATION CAPACITOR WITH ENHANCED BOTTOM PLATE

CROSS-REFERENCE TO RELATED APPLICATION

This application claims priority to and benefit of U.S. Provisional Patent Application Ser. No. 63/234,388, filed on Aug. 18, 2021, and titled "Bottom Plate Electric Field Optimization for Enhanced Performance of a Galvanic Isolation Capacitor", the contents of which are hereby fully incorporated by reference.

BACKGROUND

Electronic devices may have circuits and/or components in multiple voltage domains, such as low voltage logic circuitry in a low voltage domain, and communications driver circuits in a second, high voltage domain. In normal operation, high voltage digital isolators provide communication channels between different voltage domains while protecting low voltage circuits against device degradation from harmful currents or voltages on the high voltage domain. In galvanic isolation capacitor systems used for single die reinforced (SDR) isolation, the isolation capability can be limited by dielectric breakdown near the plates of the capacitor which occurs when the peak electric field (Epk) exceeds or approaches the dielectric strength of the surrounding dielectric.

SUMMARY

In one aspect, an electronic device includes a semiconductor layer, a multilevel metallization structure over the semiconductor layer, a capacitor, and a conductive shield. The multilevel metallization structure has a first region, a second region, a pre-metal level on the semiconductor layer, and metallization structure levels over the pre-metal level. The pre-metal level and the metallization structure levels extend in respective planes of orthogonal first and second directions and are arranged in a stack along a third direction orthogonal to the first and second directions. The metallization structure levels include a first metallization structure level and a second metallization structure level. The capacitor is in the first region of the multilevel metallization structure and has first and second terminals that form respective first and second capacitor plates in the first and second metallization structure levels. The first terminal overlaps the second terminal by an overlap distance of 1.0 μm to 6.0 μm in the first and second directions. The conductive shield is between the first and second regions and is coupled to the semiconductor layer. The conductive shield has interconnected metal lines and vias in the respective metallization structure levels that at least partially encircle the first region. The conductive shield includes a first metal line that encircles the first terminal in the first metallization structure level and the first metal line is spaced apart from the first terminal by a gap distance of 0.5 μm to 1.0 μm.

In another aspect, a packaged electronic device includes a semiconductor die with a multilevel metallization structure over a semiconductor layer, a capacitor, and a conductive shield, and an electrical connection, a package structure, and conductive leads. The multilevel metallization structure has a first region, a second region, a pre-metal level on the semiconductor layer, and metallization structure levels over the pre-metal level. The pre-metal level and the metallization structure levels extend in respective planes of orthogonal first and second directions and are arranged in a stack along a third direction orthogonal to the first and second directions. The metallization structure levels include a first metallization structure level and a second metallization structure level. The capacitor is in the first region of the multilevel metallization structure and has first and second terminals that form respective first and second capacitor plates in the first and second metallization structure levels. The first terminal overlaps the second terminal by an overlap distance of 1.0 μm to 6.0 μm in the first and second directions. The conductive shield is between the first and second regions and is coupled to the semiconductor layer. The conductive shield has interconnected metal lines and vias in the respective metallization structure levels that at least partially encircle the first region. The conductive shield includes a first metal line that encircles the first terminal in the first metallization structure level and the first metal line is spaced apart from the first terminal by a gap distance of 0.5 μm to 1.0 μm. The electrical connection has an end soldered or bonded to the exposed side of the second terminal, the package structure encloses the semiconductor die and the electrical connection, and the conductive leads are exposed along one or more sides of the package structure.

In a further aspect a method includes forming a multilevel metallization structure over a semiconductor layer, with a multilevel metallization structure over a semiconductor layer, a capacitor, and a conductive shield. The multilevel metallization structure has a first region, a second region, a pre-metal level on the semiconductor layer, and metallization structure levels over the pre-metal level. The pre-metal level and the metallization structure levels extend in respective planes of orthogonal first and second directions and are arranged in a stack along a third direction orthogonal to the first and second directions. The metallization structure levels including a first metallization structure level and a second metallization structure level. The capacitor is in the first region of the multilevel metallization structure and has first and second terminals that form respective first and second capacitor plates in the first and second metallization structure levels. The first terminal overlaps the second terminal by an overlap distance of 1.0 μm to 6.0 μm in the first and second directions. The conductive shield is between the first and second regions and is coupled to the semiconductor layer. The conductive shield has interconnected metal lines and vias in the respective metallization structure levels that at least partially encircle the first region. The conductive shield includes a first metal line that encircles the first terminal in the first metallization structure level and the first metal line is spaced apart from the first terminal by a gap distance of 0.5 μm to 1.0 μm. The method also includes separating a semiconductor die including the semiconductor layer and the multilevel metallization structure from a wafer, forming an electrical connection to the second terminal of the capacitor, and enclosing the semiconductor die and the electrical connection in a package structure with conductive leads exposed along one or more sides of the package structure.

BRIEF DESCRIPTION OF THE DRAWINGS

FIG. 3 is a flow diagram of a method of fabricating a packaged electronic device.

FIGS. 4-23 are partial sectional side elevation views of the device of FIGS. 1-1D undergoing metallization structure fabrication processing according to the method of FIG. 5.

DETAILED DESCRIPTION

Figure 1:
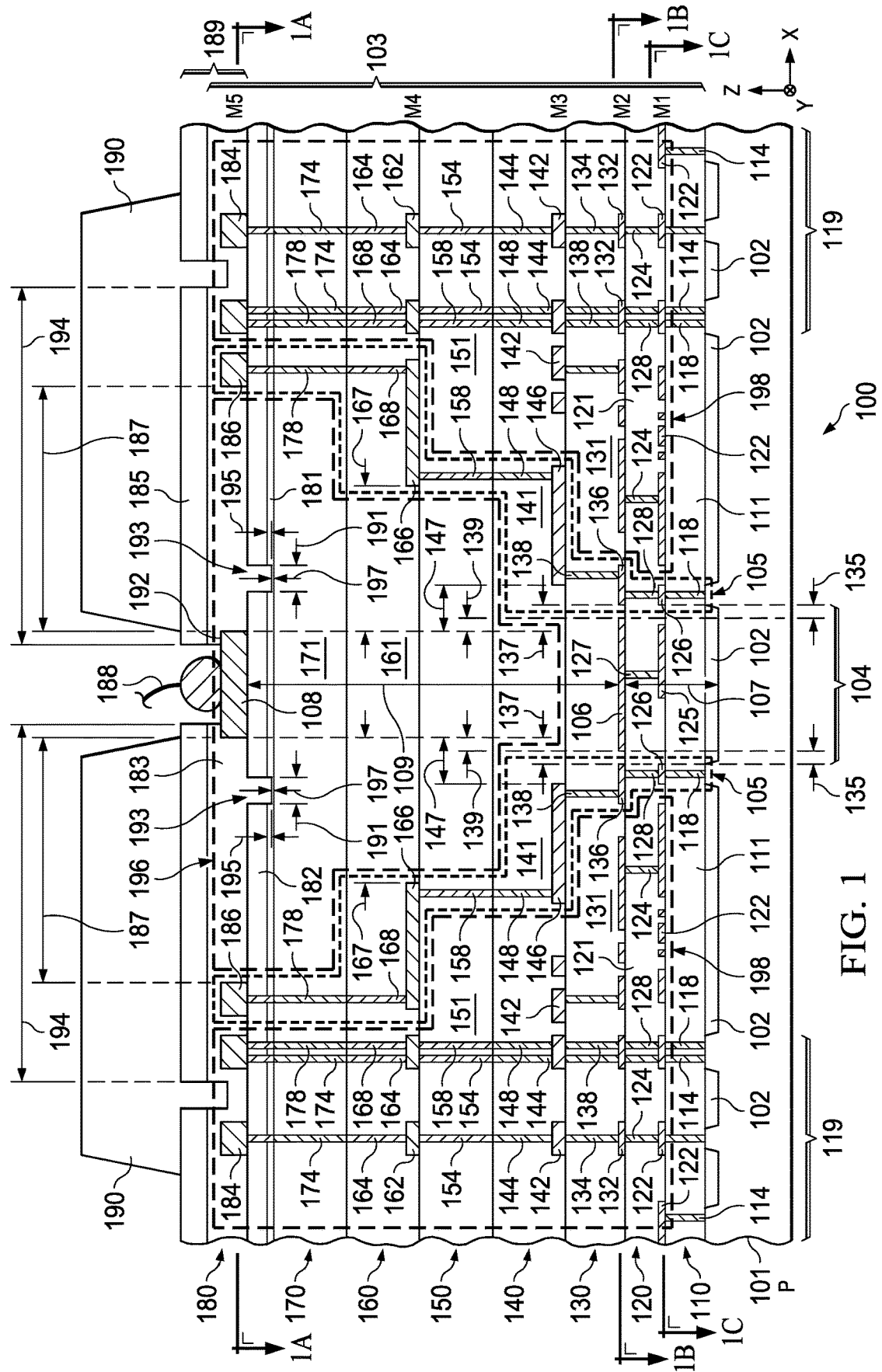
FIG. 1 is a partial sectional side elevation view of an isolation portion of an electronic device with an isolation capacitor in a first region encircled by a conductive shield in a multilevel metallization structure above a semiconductor layer.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

Figure 1A:
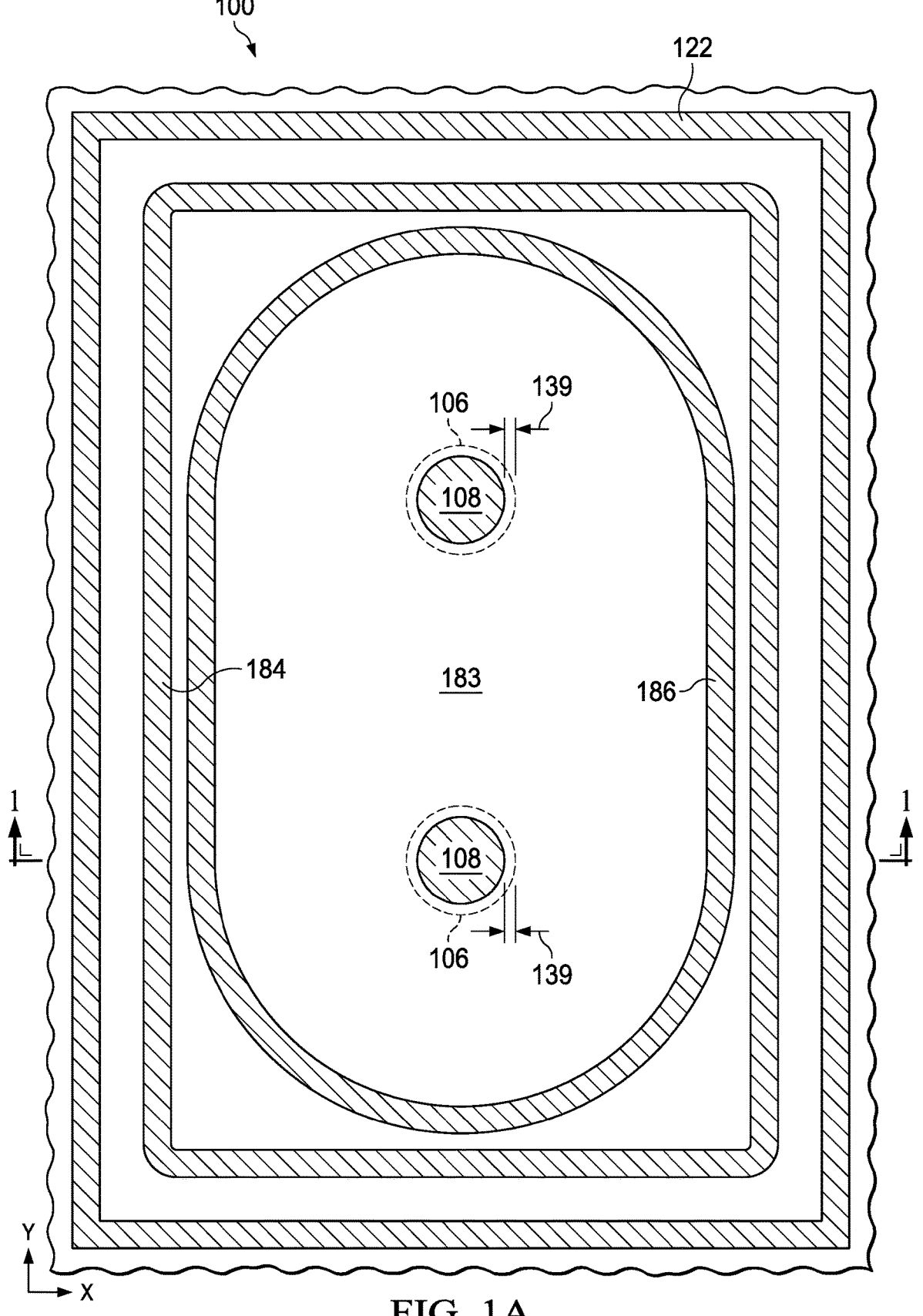
FIG. 1A is a partial sectional top plan view taken along line 1A-1A in the electronic device of FIG. 1.
Figure 1B:
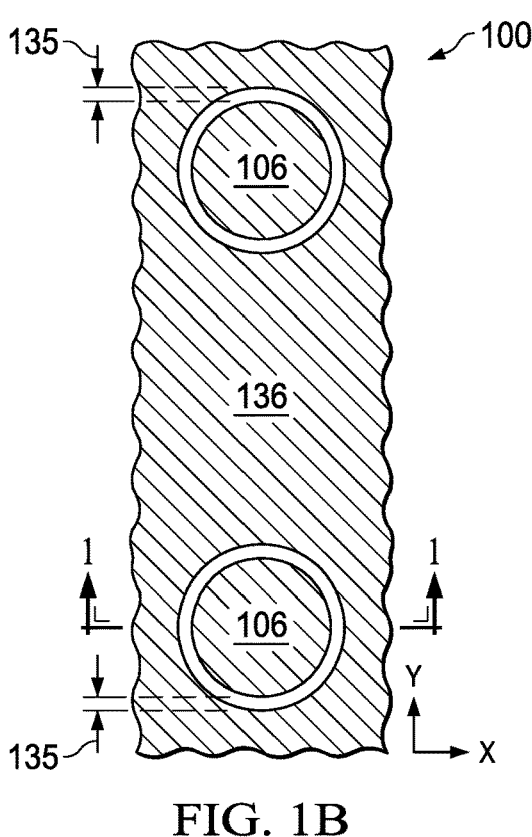
FIG. 1B is a partial sectional top plan view taken along line 1B-1B in the electronic device of FIG. 1.
Figure 1D:
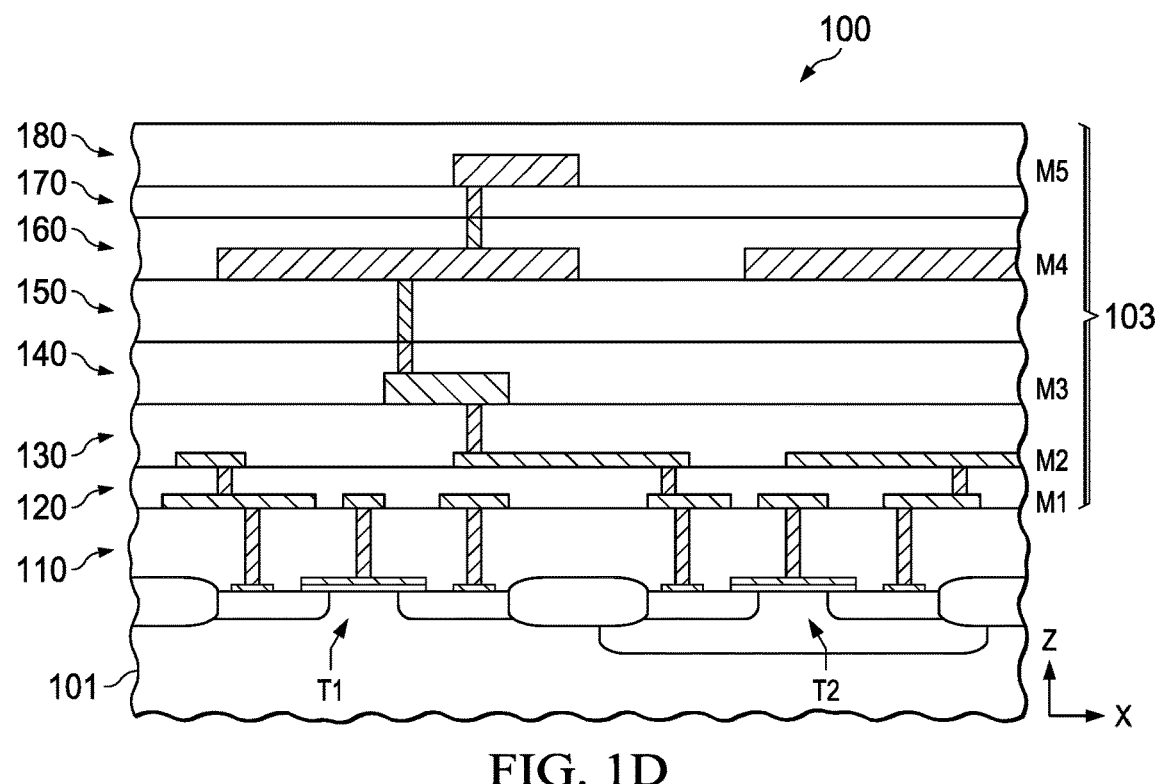
FIG. 1D is a partial sectional side elevation view of an active region of the electronic device.
Figure 1C:
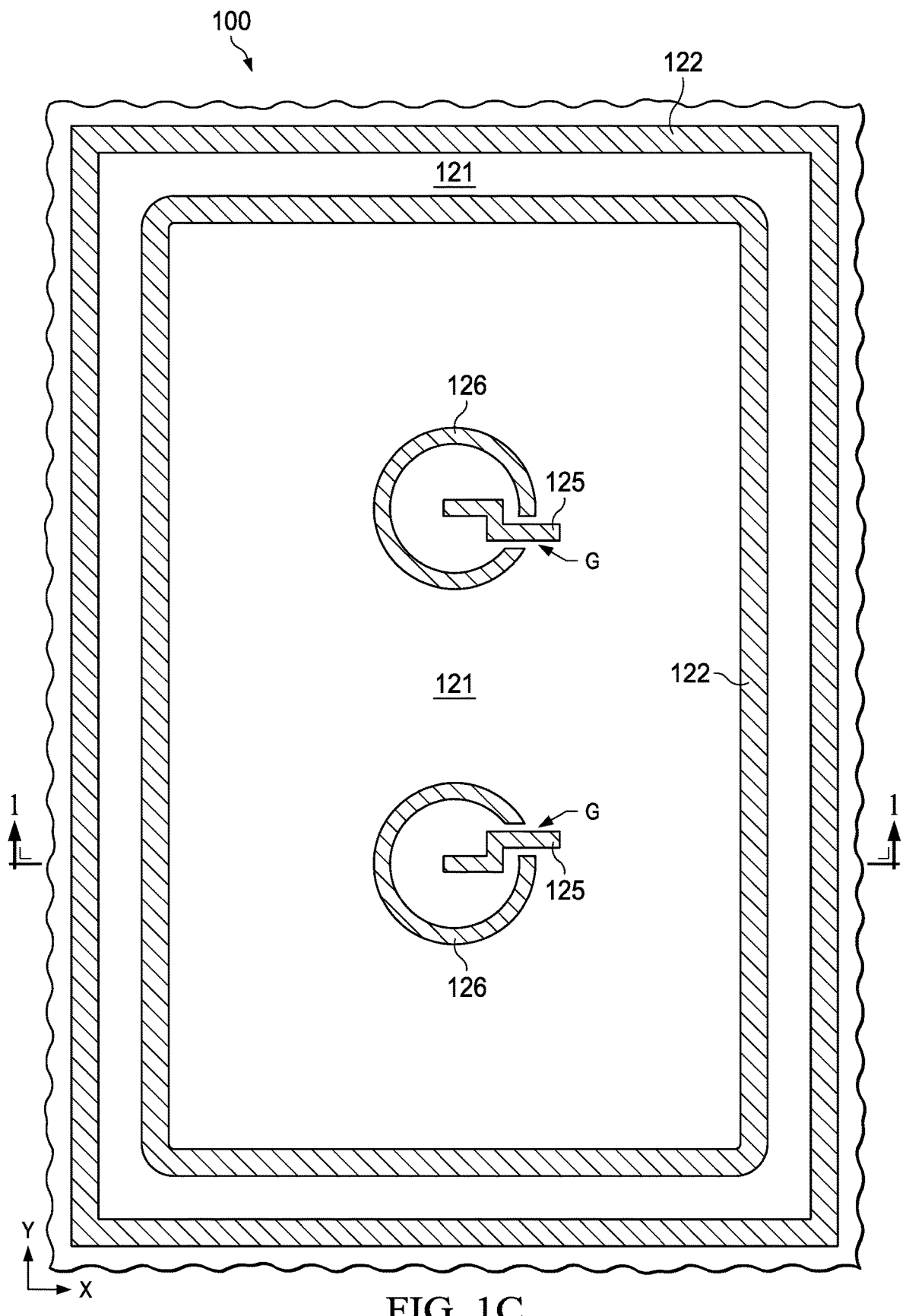
FIG. 1C is a partial sectional top plan view taken along line 1C-1C in the electronic device of FIG. 1.

Referring initially to FIGS. 1-1D, FIG. 1 shows a partial sectional side view of an electronic device 100 with a semiconductor layer 101, FIGS. 1A-1C show respective top section views of portions of the electronic device 100 taken along respective lines 1A-1A, 1B-1B, and 1C-1C in FIG. 1, and FIG. 1D shows a partial sectional side view of an active region of the electronic device 100 having transistors T1 and T2 formed on or in the semiconductor layer 101. In one example, the semiconductor layer 101 is or includes a p-type semiconductor material having isolation structures (e.g., shallow trench isolation or STI structures) formed on or in a top side of the semiconductor layer 101. The semiconductor layer 101 in one example is a silicon layer, a silicon-germanium layer, a silicon-on-insulator (SOI) structure, or another layer or layers having semiconductor material. The semiconductor layer 101 in some examples may be a semiconductor wafer (e.g., a handle wafer) or a semiconductor layer over a wafer, such as an epitaxial layer over a handle wafer. In various examples the semiconductor layer 101 may be referred to as a semiconductor substrate.

The electronic device 100 includes a multilevel metallization structure 103 disposed over (e.g., on and directly contacting) a top side of the semiconductor layer 101. In addition, the electronic device 100 includes a capacitor 104 and a conductive shield 105 in the multilevel metallization structure 103. The multilevel metallization structure 103 has a first region 196, a second region 198, a pre-metal level 110 on the semiconductor layer 101, and metallization structure levels 120, 130, 140, 150, 160, 170 and 180 over the pre-metal level 110. The pre-metal level 110 and the metallization structure levels 120, 130, 140, 150, 160, 170, 180 extend in respective planes of respective orthogonal first and second directions X, Y and are arranged in a stack along a third direction Z that is orthogonal to the first and second directions X and Y.

As discussed further below, the capacitor 104 is in a first region 196 of the multilevel metallization structure 103, and the conductive shield 105 is formed by interconnected metal lines and trench contacts and vias of the multilevel metallization structure to provide a Faraday cage around the first region 196 and the capacitor 104. The conductive shield 105 separates the first region 196 from an outer second region 198 of the multilevel metallization structure 103. As shown in FIG. 1D, in one implementation, the electronic device 100 also includes further circuitry (e.g., low voltage logic circuits) such as transistors T1 and T2 formed on and/or in the semiconductor layer 101 beneath the outer second region 198 of the multilevel metallization structure 103. The capacitor 104 in FIG. 1 includes a first (e.g., lower or bottom) terminal 106 (e.g., a first capacitor plate) that is spaced from the semiconductor layer 101 by a distance 107 (e.g., 2.8 μm). The capacitor 104 also includes a second (e.g., upper or top) terminal 108 (e.g., a second capacitor plate). In one example shown in FIG. 1C, the conductive shield 105 includes a gap in one of the constituent metal layers, and a metal routing feature 125 connects low voltage logic circuitry of the second region to the first terminal 106 of the capacitor 104.

In this or another example, the electronic device includes two or more isolation capacitors 104, for example, individually having circular first and second terminals 106 and 108 in the first region 196. In other example, one or both of the first and second capacitor terminals 106, 108 can be of different shapes. In another implementation, the first plates 106 of two capacitors 104 are electrically coupled to one another to form a series combination of two capacitors 104 for isolating high and low voltage circuits of the electronic device 100 with circuit connections to the respective second terminals 108 of the series-connected capacitors 104. The first and second terminals 106 and 108 are generally parallel to one another, although not a strict requirement of all possible implementations. In addition, the first and second terminals 106 and 108 are separated from one another by a distance 109 (e.g., 17.5-20.5 μm), with dielectric material layers between the terminals 106 and 108 to form the capacitor 104. In the illustrated example, the second terminal 108 of the capacitor 104 includes an exposed top side 192 that allows bond wire or other connection to the second terminal 108 for electrical coupling to a high voltage domain terminal of a second semiconductor die (e.g., FIG. 2 below).

The multilevel metallization structure 103 includes a pre-metal level 110 and an integer number N metallization structure levels, where N is greater than 2. The example of FIGS. 1-1D includes N=7 metallization structure levels. In the illustrated example, dual stacked via loops are included for pairs of the metallization structure levels to increase the capacitor dielectric thickness in an integrated fabrication process that provides active and isolation regions with transistor circuitry as well as high voltage isolation capacitors. The electronic device 100 incorporates various features detailed further below to integrated series-connected high voltage isolation capacitors in the multilevel metallization structure 103 having a thickness of about 12 to 13 μm tailored for low voltage active circuitry, with reinforced isolation by series capacitors 104 with combined capacitor dielectric (e.g., SiO$_2$) thickness up to about 20 μm and/or single capacitor reinforced isolation realized by a single capacitor 104 with capacitor dielectric (e.g., SiO$_2$) thickness up to about 20.5 μm on a single die. The electronic device 100 in FIG. 1 uses dual stacked vias in the pair of metallization structure levels 160 and 170, as well as in the pair of metallization structure levels 140 and 150. The conductive metal routing features in this example provide five routing levels or layers, respectively indicated in FIG. 1 as M1 in the metallization structure level 120, M2 in the metallization structure level 130, M3 in the metallization structure level 140, M4 in the metallization structure level 160, and M5 in the metallization structure level 180. In some examples, the illustrated electronic device 100 also includes high voltage isolation capabilities enhanced by use of a silicon oxynitride/silicon nitride bilayer beneath the second terminal 108. The bilayer includes an upper silicon nitride layer 182 and a silicon oxynitride layer 181, and is sometimes referred to as SO bilayer 181, 182, or simply as "SO bilayer". A trench in the SO bilayer 181, 182 is spaced laterally outward from the second terminal 108 and extends through the upper silicon nitride layer 182 and partially into, and stopping in, the silicon oxynitride layer 181.

The pre-metal level 110 includes a pre-metal dielectric (PMD) layer 111 on the semiconductor layer 101. In one example, the PMD layer 111 is or includes silicon dioxide (SiO$_2$) with a thickness of about 1.0 μm. The pre-metal level 110 includes conductive cylindrical pre-metal contacts 114 and pre-metal trench contacts 118 on the semiconductor layer 101. The contacts 114 and 118 in one example are or include tungsten but can be or include one or more other conductive metals. The contacts 114 and 118 extend through the PMD layer 111 along the vertical (e.g., Z) direction in FIG. 1. The trench contact 118 encircles a central first portion of the PMD layer 111 in the pre-metal level 110 with no gap. In one example, the pre-metal level contacts 114 and the trench contacts 118 are or include tungsten. In one implementation, the multilevel metallization structure 103 includes aluminum conductive routing features or traces patterned according to a device design, and tungsten contacts in levels having respective silicon dioxide (e.g., TEOS oxide or SiO$_2$) layers. In other implementations, different dielectric and/or conductive metal materials can be used (e.g., copper). In the illustrated example, the pre-metal trench contact 118 is connected to the semiconductor layer 101 to form a ground connection between STI structures 102 as shown in FIG. 1 to provide a lower section of the conductive shield 105 that operates as a grounded Faraday cage around the capacitor 104 to protect surrounding circuitry in region 198 from being adversely impacted by high electric fields present in the first region 196. The pre-metal level 110 also includes trench contacts 118 in regions 119 near the outer periphery of the illustrated portion of the electronic device 100, for example, to provide protection against cracks and mechanical stress on the device 100 as well as provide a barrier against ingress from external ionic contamination at the die edge, although not a strict requirement of all possible implementations.

As shown in FIGS. 1 and 1C, the multilevel metallization structure 103 also includes an initial metallization structure level 120 (e.g., labelled M1 in FIG. 1) on the pre-metal level 110. The metallization structure level 120 includes a first interlevel dielectric (ILD) layer 121, as well as conductive metal routing lines 122 (e.g., aluminum or copper) and cylindrical routing vias 124 (e.g., tungsten) in the second portion of the multilevel metallization structure 103. The metallization structure level 120 also includes a metal routing feature 125, a first metal line 126, and a routing via 127 on the metal routing feature 125 in the first portion of the multilevel metallization structure 103. The first metal line 126 in one example is or includes aluminum metal with a thickness along the Z direction in FIG. 1 of approximately 0.61 μm. In addition, the metallization structure level 120 includes a first trench via 128 on the first metal line 126. The first ILD layer 121 extends on the PMD layer 111, the metal routing feature 125, and the first metal line 126. The first metal line 126 extends at least partially on the pre-metal trench contact 118, and the first trench via 128 extends on the first metal line 126. The first trench via 128 and the first metal line 126 encircle another portion of the first region of the multilevel metallization structure 103 in the first metallization structure level 120. The first ILD layer 121 in one example is or includes silicon dioxide (SiO$_2$) with a thickness (e.g., along the Z direction in FIG. 1) of approximately 1.0 μm.

As shown in FIG. 1C, the metal routing feature 125 in one example extends from the first region, through a gap G in the first metal line 126, to the second region of the first metallization structure level 120. The metallization structure level 120 also includes first trench vias 128 in the region 119 near the outer periphery of the illustrated portion of the electronic device 100, for example, to provide crack suppression during die singulation as well as provide a barrier against ingress from external ionic contamination at the die edge, although not a strict requirement of all possible implementations. The metallization structure level 120, and the other metallization structure levels in the example of FIGS. 1-1D includes contacts 114 and trench contacts 118 that are or include tungsten, although not a requirement of all possible implementations. In addition, the first metallization structure level 120 and the other metallization structure levels of the multilevel metallization structure 103 include metal lines that are or include aluminum or copper, although not a requirement of all possible implementations.

The metallization structure level 130 (labeled M2 in FIG. 1) extends on the metallization structure level 120 in the multilevel metallization structure 103. The metallization structure level 130 includes a second ILD layer 131, as well as conductive metal lines 132 and cylindrical tungsten vias 134 in the second portion region 198 of the multilevel metallization structure 103. The second ILD layer 131 in one example is or includes silicon dioxide with a thickness along the Z of approximately 1.2 μm. The metallization structure level 130 further includes a second metal line 136 at least partially on the first trench via 128, and a second trench via 138 on the second metal line 136. The second metal line 136 in one example is or includes aluminum metal with a thickness along the Z direction in FIG. 1 of approximately 0.61 μm. The metallization structure level 130 also includes the first terminal 106 of the capacitor 104, which is laterally spaced apart from the second metal line 136 by a gap distance 135 in the first and second directions X and Y. The gap distance 135 in one example is 0.5 μm to 1.0 μm. In another implementation, the gap distance 135 is 0.55 μm to 0.75 μm. Herein, "lateral", "laterally", and similar terms refer to dimensions or directions in the X-Y plane as marked in FIG. 1, e.g., parallel to a top surface of the semiconductor layer 101.

The first terminal 106 of the capacitor 104 extends at least partially over and contacts the routing via 127 on the metal routing feature 125 in a central first portion of the metallization structure level 130. The second ILD layer 131 in this example extends on the first ILD layer 121, the second metal line 136, and the first terminal 106. A second trench via 138 extends on the second metal line 136. The second trench via 138 and the second metal line 136 encircle a second portion of the first region 196 of the metallization structure level 130. As shown in FIG. 1, the second terminal 108 of the capacitor 104 includes lateral edges (left and right sides in FIG. 1), and the respective first metal lines 126 and second metal lines 136 include opposite lateral edges spaced from the respective lateral edges of the second terminal 108 along a first direction (e.g., the X direction in FIGS. 1-1D) by respective a non-zero spacing distance 137. The metallization structure level 130 also includes trench vias 138 in the region 119 near the outer periphery of the illustrated portion of the electronic device 100, although not a strict requirement of all possible implementations.

The metallization structure level 140 (labeled M3 in FIG. 1) extends on the metallization structure level 130 and includes a third ILD layer 141, as well as conductive metal lines 142 and cylindrical tungsten vias 144 in the second region 198 of the multilevel metallization structure 103. The third ILD layer 141 in one example is or includes silicon dioxide with a thickness along the Z direction of approximately 3 μm. The metallization structure level 140 further includes a third metal line 146 at least partially on the second trench via 138, and a third trench via 148 on the third metal line 146. The third metal line 146 in one example is or includes aluminum metal with a thickness along the Z direction in FIG. 1 of approximately 1.3 μm. The third ILD layer 141 in this example extends on the second ILD layer 131 and the third metal line 146. A third trench via 148 extends through the third ILD layer 141 on the third metal line 146. The third trench via 148 and the third metal line 146 encircle a portion of the first region 196 of the metallization structure level 140. As shown in FIG. 1, the third metal line 146 includes lateral edges spaced from the respective lateral edges of the second terminal 108 along the X direction by a non-zero spacing distance 147. The conductive shield 105 includes a staircase shape shown in FIG. 1, in which the non-zero spacing distance 147 (e.g., approximately 30 μm) is greater than the spacing distance 137 of the preceding (e.g., underlying) metallization structure level 130. The metallization structure level 140 also includes a trench via 148 in the region 119 near the outer periphery of the illustrated portion of the electronic device 100, although not a strict requirement of all possible implementations.

The metallization structure level 150 extends on the metallization structure level 140 and includes a fourth ILD layer 151 and stacked cylindrical tungsten vias 154 in the second region 198 of the multilevel metallization structure 103. The fourth ILD layer 151 in one example is or includes silicon dioxide with a thickness along the Z direction of approximately 3 μm. The metallization structure level 150 further includes fourth trench vias 158 stacked on the preceding trench vias 148. The third metal line 146 in one example is or includes aluminum metal with a thickness along the Z direction in FIG. 1 of approximately 1.3 μm. The fourth ILD layer 151 in this example extends on the third ILD layer 141. A fourth trench via 158 extends through the fourth ILD layer 151. The fourth trench via 158 encircles a portion of the first region 196 of the metallization structure level 150. The metallization structure level 150 also includes trench vias 158 in the region 119 near the outer periphery of the illustrated portion of the electronic device 100, although not a strict requirement of all possible implementations.

The metallization structure level 160 (labeled M4 in FIG. 1) extends on the metallization structure level 150 in the multilevel metallization structure 103. The metallization structure level 160 includes a fifth ILD layer 161, as well as conductive metal lines 162 and 166 and cylindrical tungsten vias 164 in the second portion of the multilevel metallization structure 103. The fifth ILD layer 161 in one example is or includes silicon dioxide with a thickness along the Z direction of approximately 3 μm. The metallization structure level 160 further includes the fifth metal line 166 at least partially on the fourth trench via 158, and a fifth trench via 168 on a fifth metal line 166. The fifth metal line 166 in one example is or includes aluminum metal with a thickness along the Z direction in FIG. 1 of approximately 1.3 μm. The fifth ILD layer 161 in this example extends on the fourth ILD layer 151 and the fifth metal line 166. A fifth trench via 168 extends through the fifth ILD layer 161 on the fifth metal line 166. The fifth trench via 168 and the fifth metal line 166 encircle a portion of the first region of the fifth metallization structure level 160. As shown in FIG. 1, the fifth metal line 166 includes lateral edges spaced from the respective lateral edges of the second terminal 108 along the X direction by a non-zero spacing distance 167 (e.g., approximately 50 μm) that is greater than the spacing distance 147 of the lower metallization structure level 140. The metallization structure level 160 also includes trench vias 168 in the region 119 near the outer periphery of the illustrated portion of the electronic device 100, although not a strict requirement of all possible implementations.

The (sixth) metallization structure level 170 extends on the metallization structure level 160 in the multilevel metallization structure 103. The metallization structure level 170 includes a sixth ILD layer 171, as well as stacked cylindrical tungsten vias 174 in the second region 198 of the multilevel metallization structure 103. The sixth ILD layer 171 in one example is or includes silicon dioxide with a thickness along the Z direction of approximately 3 μm. The metallization structure level 170 further includes a sixth trench via 178 on the trench via 168. The sixth ILD layer 171 in this example extends on the fifth ILD layer 161. The sixth trench via 178 encircles a portion of the first region 196 of the metallization structure level 170. The metallization structure level 170 also includes trench vias 178 in the region 119 near the outer periphery of the illustrated portion of the electronic device 100, although not a strict requirement of all possible implementations.

The example multilevel metallization structure 103 in FIGS. 1-1D has N metallization structure levels, where N=7. The uppermost or top (e.g., $N^{th}$ or seventh) metallization structure level 180 (labeled M5 in FIG. 1) extends on the metallization structure level 170 in the multilevel metallization structure 103. The metallization structure level 170 includes the SO bilayer 181, 182 with a 0.3 μm thick layer 181 that is or includes silicon oxynitride (SiON), and a 0.55 μm layer 182 that is or includes silicon nitride (SiN). The metallization structure level 180 underlies a dielectric layer 183 (e.g., $SiO_2$), conductive metal lines 184 in the second region 198 of the multilevel metallization structure 103, some of which lead to conductive die pads (not shown) that provide electrical conductivity to external components (e.g., another die or a conductive feature of a lead frame, not shown). A dielectric layer 185 (e.g., silicon oxynitride) extends on portions of the layer 183 and has a thickness in one example of 2.8 μm. Together, the dielectric layers 183 and 185 form a protective overcoat (PO) stack 189.

In addition, the metallization structure level 180 includes the second terminal 108 of the capacitor 104 and a seventh (e.g., $N^{th}$) metal line 186. The second terminal 108 is laterally spaced from the $N^{th}$ metal line 186 as shown in FIGS. 1 and 1A by a non-zero spacing distance 187 (e.g., approximately 75 μm) that is greater than the spacing distance 167 of the preceding (e.g., underlying) metallization structure level 160. The dielectric layer 183 in one example is or includes silicon dioxide with a thickness along the Z direction of approximately 4.5 μm. The seventh metal line 186 extends at least partially on the sixth trench via 178. The seventh metal line 186 in one example is or includes aluminum metal with a thickness along the Z direction in FIG. 1 of approximately 1.3 μm. The dielectric layer 183 in this example extends on the SO bilayer 181, 182 above the sixth ILD layer 171 in a trench 193 of the SO bilayer. In addition, the layer dielectric 183 extends on a portion of the second terminal 108 and on the seventh metal line 186. The seventh metal line 186 encircles the upper portion of the first region of the metallization structure level 180 to complete the conductive shield 105.

The example electronic device 100 in FIGS. 1-1D includes the capacitor 104 with the first terminal 106 in the metallization structure level 130, and the second terminal 108 in the metallization structure level 180. In other implementations, the respective first and second terminals 106 and 108 can be in different ones of the metallization structure levels 120, 130, 140, 150, 160, 170, 180, and can, but need not, be in adjacent levels. In the illustrated example, moreover, the staircase shape of the conductive shield 105 includes gradually increasing spacing distances 137, 147, 167, and 187, although not a strict requirement of all possible implementations. In addition, different implementations include a conductive shield with a non-staircase shape. The illustrated staircase shape advantageously provides a generally consistent spacing between the second terminal 108 of the capacitor 104 and the conductive shield 105. The conductive shield 105 provides a generally continuous conductive metal (e.g., copper, tantalum nitride, titanium, titanium nitride, aluminum, tungsten) Faraday cage or shield structure that is connected by the trench contacts 118 to the semiconductor layer 101 to protect circuitry of the second region 198 from being adversely impacted by high electric fields. In one example, copper-doped aluminum lines are sandwiched by titanium nitride, and copper lines are encapsulated on three sides by tantalum nitride. Trench vias in certain implementations are or include tungsten or copper for copper damascene schemes, to form all or parts of the conductive shield 105.

In one implementation, the second terminal 108 of the capacitor 104 is electrically connected to a high-voltage signal from a circuit (e.g., and a second semiconductor die) in a different voltage domain than circuitry of the second region 198 of the multilevel metallization structure 103. In one example, the electronic device 100 includes low-voltage logic circuitry (e.g., transistors T1 and T2 in FIG. 1D) with connections and routing structures in the second region 198 of the multilevel metallization structure 103. In the illustrated implementation, the conductive shield 105 is created by the interconnected metal lines 126, 136, 146, 166, 186 and trench contacts/vias 118, 128, 138, 148, 158, 168, 178 in the respective metallization structure levels 120, 130, 140, 150, 160, 170, 180 that encircle the first region 196 of the multilevel metallization structure 103, with only one or more small gaps G (e.g., FIG. 3) for electrical connection of the first terminal 106 to low voltage circuitry or connections of the second region 198 of the multilevel metallization structure 103. In another implementation, the first terminals 106 of two or more of the capacitors 104 are connected together in the first region 196 with no gaps in the conductive shield 105. In another implementation, the trench contacts/vias 118, 128, 138, 148, 158, 168, 178 could be a discontinuous array of contacts/vias 114, 124, 134, 144, 154, 164, 174.

The electronic device 100 in one example includes two or more capacitors 104 (e.g., capacitors with top plates or second terminals 108 seen in FIG. 1A). In one implementation, a pair, or multiple pairs, of capacitors 104 are provided in the first region 196 of the multilevel metallization structure 103, and the conductive shield 105 provides a single grounded Faraday cage structure that surrounds all the capacitors 104. In a further alternate implementation, multiple conductive shields 105 are created in the multilevel metallization structure 103, to provide multiple grounded Faraday cage structures that individually surround one or more associated capacitors 104 in respective first regions 196. In the example of FIGS. 1-1D, the individual capacitors 104 are laterally spaced from one another in the first region of the multilevel metallization structure 103, and individually include first and second terminals 106 and 108 that are in different ones of the metallization structure levels (e.g., the metallization structure levels 130 and 180 in the illustrated example). In the example device 100, moreover, each of the capacitors 104 includes an associated metal routing feature 125 extending through a corresponding gap G in the first metal line 126.

As shown in FIG. 1, the example upper capacitor plates or second terminals 108 can be wire bonded or otherwise electrically connected to another circuit (e.g., of a high voltage domain, or of different voltage domains). FIG. 1 shows one example in which a bond wire 188 has a first end bonded to an exposed top side 192 of the second terminal 108 to facilitate electrical connection to a conductive feature of another die (e.g., as illustrated and described further below in connection with FIG. 2). The example electronic device 100 also includes a 10 μm thick polyimide layer 190 that extends over portions of the PO stack 189. The polyimide layer 190 in one example provides a stress barrier to mitigate mechanical stress on the semiconductor layer 101 and the multilevel metallization structure 103 following enclosure in a molded packaging structure, for example, to mitigate mechanical stress between the overlying mold compound and the surface of the silicon oxynitride layer 185 that could potentially delaminate after some number of temperature cycling events.

The polyimide layer 190, and the PO stack 189 in this example include a gap that exposes the top side 192 of the second terminal 108. The silicon nitride layer 182 in this example includes a gap with width 191 fully surrounding the second terminal 108. In addition, the PO stack 189 includes a recess or gap laterally spaced along the X direction from the bond wire opening by a distance 194 (e.g., 273 μm). This recess or gap is located between the outermost conductive lines 184 in one example in order to terminate dicing-induced cracks from entering the die. The distance 194 varies in different implementations depending on what external circuitry exists around the capacitor or capacitors 104, and the recess or gap fully surrounds the die in one example. As shown in dashed line form in FIG. 1, the conductive shield 105 provides a grounded Faraday cage with a telescoping staircase structure that surrounds the capacitor 104 and separates the first region 196 (e.g., associated with a high-voltage domain) from the second region 198 (e.g., associated with a lower or different voltage domain).

The first capacitor terminal 106 in the illustrated example is formed in the metallization structure level 130, referred to as a first metallization structure level 130 even though it need not be the lowermost metallization structure level. The second capacitor terminal 108 in this example is formed in the metallization structure level 180 and is referred to herein as a second metallization structure level, although it need not be the second level in the metallization structure stack arrangement. The first and second metallization structure levels in other examples can be adjacent in the stack arrangement. The first terminal 106 forms the bottom or lower first capacitor plate in the first metallization structure level 130 in the illustrated orientation of FIG. 1, and the second terminal 108 forms the top or upper second capacitor plate in the metallization structure level 180.

As shown in FIGS. 1 and 1A, the first terminal 106 overlaps the second terminal 108 by an overlap distance 139 in the first and second directions X and Y, where the overlap distance 139 is 1.0 μm to 6.0 μm in one implementation. In another example, the overlap distance 139 is 2.0 μm to 5.0, for example, approximately 3. The conductive shield 105 extends between the first region 196 and the second region 198 in the multilevel metallization structure 103 and at least partially encircles the first region 196 of the multilevel metallization structure 103. The conductive shield 105 in one example is coupled to the semiconductor layer 101. In addition, the conductive shield 105 in FIGS. 1-1D includes the metal line 136 that encircles the first terminal 106 in the first metallization structure level 130. The metal line 136 is laterally spaced apart from the first terminal 106 by a gap distance 135 shown in FIGS. 1 and 1B in the first and second directions X and Y. The gap distance 135 in one example is 0.5 μm to 1.0 μm. In another example, the gap distance 135 is 0.55 μm to 0.75 μm.

In the illustrated electronic device 100, moreover, the multilevel metallization structure 103 includes the SO bilayer with the layers 181 and 182. In another example, the SO bilayer is formed on a different one of the metallization structure levels under the second capacitor terminal 108. The SO bilayer has the silicon oxynitride layer 181 and the silicon nitride layer 182 on the silicon oxynitride layer 181, and the second terminal 108 extends on (e.g., and contacts) a portion of the silicon nitride layer 182 as seen in FIG. 1. The example of FIG. 1 also includes a trench 193 in the SO bilayer. As seen in FIG. 1, the trench 193 is spaced laterally outward from the second terminal 108 in the first and second directions X and Y, and the trench 193 extends through the silicon oxynitride layer 181 along the third direction Z. As shown in FIG. 1, the trench 193 extends by a distance 195 partially into the silicon oxynitride layer 181 along the third direction Z, leaving a non-zero thickness 197 of the silicon oxynitride layer 181 at the bottom of the trench 193. The trench 193 is filled with the dielectric layer 183 of the metallization structure level 180 (e.g., $SiO_2$).

Figure 2A:
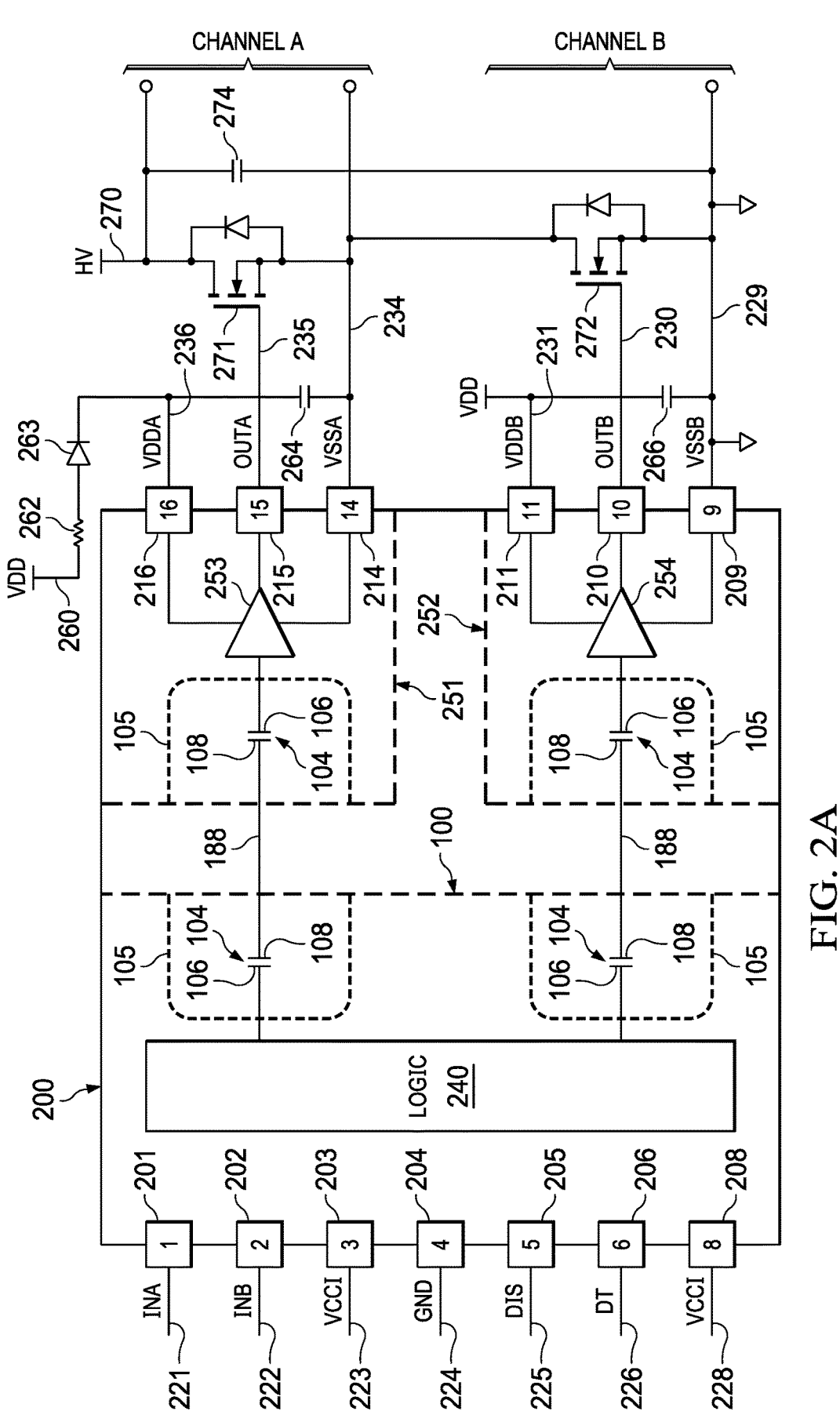
FIG. 2A is a schematic diagram of one example of a packaged electronic device including high voltage capacitors on the device of FIGS. 1-1D and high voltage capacitors on first and second additional semiconductor dies.
Figure 2B:
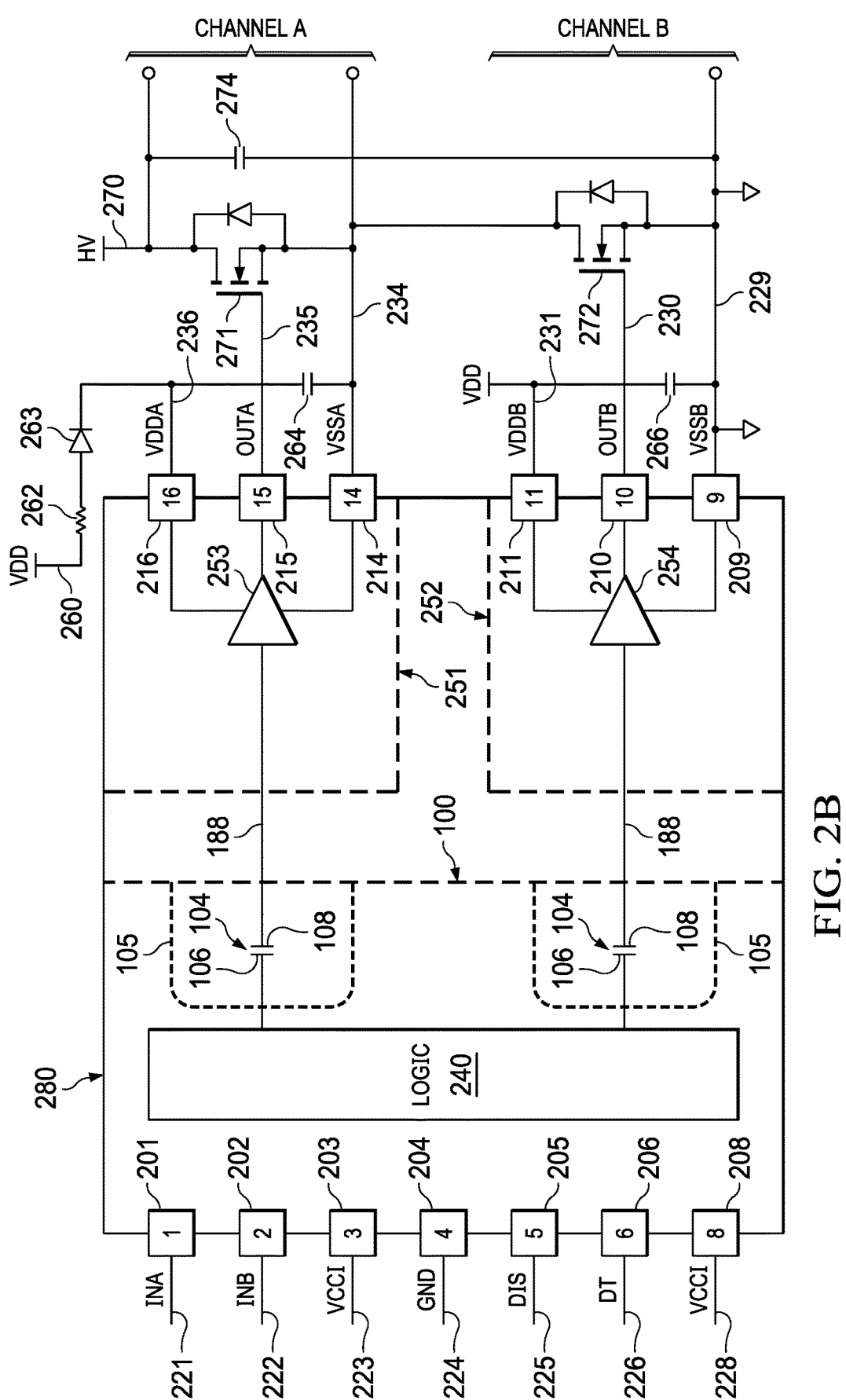
FIG. 2B is a schematic diagram of another example of a packaged electronic device having high voltage capacitors on the device of FIGS. 1-1D.
Figure 2C:
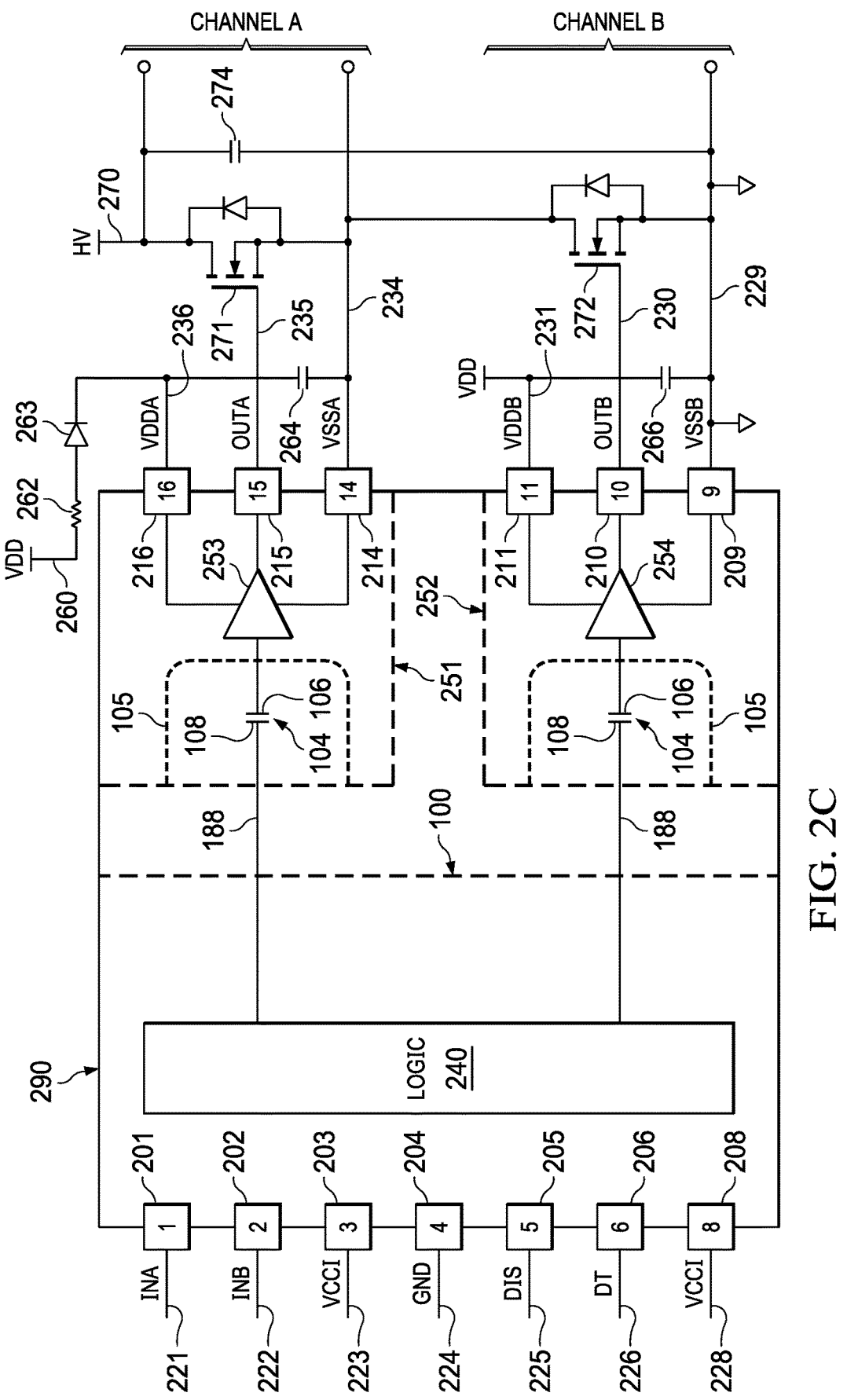
FIG. 2C is a schematic diagram of another example of a packaged electronic device including high voltage capacitors on first and second additional semiconductor dies.

Referring also to FIGS. 2A, 2B, and 2C, FIG. 2A schematically illustrates an example packaged electronic device 200 that includes high voltage capacitors on the above-described electronic device 100 and high voltage capacitors on first and second additional semiconductor dies. In this example, the packaged electronic device 200 includes an instance of the electronic device 100 on a first die that represents a singulated or separated semiconductor die as depicted and described above in connection with FIGS. 1-1D. The device 100 of the first die has a multilevel metallization structure 103 with a conductive shield 105 between the isolated first and second regions 196 and 198 and capacitor 104 as previously described. The first semiconductor die or electronic device 100 is packaged together with one or more additional semiconductor dies to create a packaged electronic component with conductive leads or terminals 201, 202, 203, 204, 205, 206, 208 associated with a first (e.g., low voltage) voltage domain, and conductive leads or terminals 209, 210, 211, 214, 215 and 216 associated with one or more additional (e.g., higher voltage) voltage domains.

As schematically shown in FIG. 2A, the electronic device 100 (e.g., the first semiconductor die) includes a pair of capacitors 104, each having a first terminal 106 and a second terminal 108 connected (e.g., wire bonded) to a corresponding bond wire 188. In a corresponding user application (e.g., a communication system printed circuit board), the terminals 201-206, 208-211 and 214-216 are soldered to corresponding circuit board traces 221-226, 228-231 and 234-236 to provide electrical interconnection and operation with associated signal lines or signals INA, INB, VCCI, GND, DIS, DT, VCCI, VSSB, OUTB, VDDB, VSSA, OUTA and VDDA, respectively. The first die or electronic device 100 in this example includes a logic circuit 240 that provides low voltage first and second communication channel signals to the first terminals 106 of the respective capacitors 104.

The conductive shield 105 of the first semiconductor die electronic device 100 in FIGS. 1 and 2A protects the first portion 196 of the multilevel metallization structure 103 from high voltages associated with the second terminals 108. The capacitors 104 in FIG. 2A provide an isolation barrier between the logic circuit 240 and capacitively coupled circuits of first and second additional semiconductor dies 251 and 252 of the packaged electronic device 200. In one example, the semiconductor dies 251 and 252 also include a multilevel metallization structure 103 with a conductive shield 105 between the isolated first and second regions 196 and 198 and a capacitor 104 with plate terminals 106 and 108 as previously described. As shown in FIG. 2A, the respective bond wires 188 are wire bonded to the exposed top sides 192 of the second terminals 108 to provide series connected capacitor coupling between the logic circuit 240 and respective drivers 253 and 254 of the semiconductor dies 251 and 252. In another example, the second and third semiconductor dies 25 1and 252 do not include internal isolation capacitors, and the bond wires 188 are soldered to a conductive feature of the respective semiconductor dies 251 and 252, for example, to inputs of the respective drivers 253 and 254 (see example in FIG. 26 below). The semiconductor dies 251 and 252 in one example are receivers of the packaged electronic device 200 with output from the respective drivers 253 and 254 connected to external circuitry that controls a voltage VSSA at a switching node 234.

A first receiver output channel (e.g., channel "A") in FIG. 2A provides a first channel driver output biased to a supply voltage VDD received at a supply node 260. The supply node 260 is connected through a boot resistor 262 and a diode 263 to provide a first supply voltage signal VDDA at the circuit board trace 236. The first driver 253 receives the first supply voltage VDDA as an upper rail supply, and a lower rail of the driver 253 is connected to the circuit board trace 234 to operate at a reference voltage VSSA. The external circuitry includes a boot capacitor 264 connected between the terminals 214 and 216, and the output of the driver 253 is connected to the terminal for 15 to provide a first gate drive output. A second receiver output channel (e.g., channel "B") includes the second driver 254 of the second semiconductor die 252, which is biased according to the supply voltage VDD and a ground reference voltage VSSB at the terminals 211 and 209, respectively. The external circuitry also includes a supply voltage capacitor 266 connected between the supply voltage VDD and the ground reference voltage VSSB at the ground reference node 229. In operation, the drivers 253 and 254 operate according to signals received through the isolated capacitively coupled channels from the logic circuit 240 and provide respective gate drive signals OUTA and OUTB connected to gates of respective high side and low side transistors 271 and 272. The high side transistor 271 has a drain terminal 270 connected to a high-voltage supply voltage HV, and a capacitor 274 is connected between the drain terminal 270 and the ground reference node 229. The source terminal of the high side transistor 271 and the drain terminal of the low side transistor 272 are connected to the switching node 234.

FIG. 2B shows another example of a packaged electronic device 280 with high voltage capacitors on the device 100. FIG. 2C shows yet another example of a packaged electronic device 290 including high voltage capacitors on the first and second additional semiconductor dies.

Referring also to FIGS. 3-25, FIG. 3 shows a method 300 of fabricating a packaged electronic device including a first die with a capacitor and multilevel isolation structure in a multilevel metallization structure. FIGS. 4-25 show partial views of the electronic device 100 (e.g., first die) of FIGS. 1-1D and 2 undergoing fabrication processing according to the method 300. The method 300 shows steps, such as acts and/or events associated with construction of a multilevel metallization structure that incorporates the capacitor 104 and the conductive shield 105. The described steps may concurrently be used for fabricating and interconnection of other electronic circuits and/or components (e.g., transistor circuits to form the logic circuit 440 in FIG. 4, etc.) in a single semiconductor die. The multilevel metallization structure 103 in one example includes metal lines, cylindrical contacts and vias and/or trench contacts and vias that electrically couple terminals of the capacitor 104 to one or more internal components (not shown).

The method 300 includes front end processing at 302, for example, fabricating one or more circuit components (e.g., transistors T1 and T2 in FIG. 1D above, etc.) on and/or in a starting wafer (e.g., on and/or in the semiconductor layer 101 above). In the electronic device 100 of FIG. 1, the front-end processing at 302 includes processing of a starting semiconductor wafer, such as a p-type silicon wafer, a SOI structure with a silicon layer, a silicon-germanium layer, or another layer having semiconductor material. The processing at 301 in one example also includes fabrication of the transistors T1 and T2 on and/or in the semiconductor layer 101, and forming isolation structures, such as the illustrated STI structures 102 on and/or in a top side of the semiconductor layer 101.

A FIGS. 4-23 show the multilevel metallization structure 103 as formed at 304, 306, 310, 320, 330, and 340 over the semiconductor layer 101. The example method 300 includes forming a pre-metal dielectric layer at 304, as well as forming associated contacts (e.g., tungsten) at 306 to create the pre-metal level 110. Thereafter, N metallization structure levels of the multilevel metallization structure 103 are fabricated level by level. FIG. 4 shows one example of the processing at 304, in which a deposition process 400 is performed that deposits PMD layer 111 (e.g., $SiO_2$) on the semiconductor layer 101. In one example, the process 400 deposits silicon dioxide to form the PMD layer 111 to a thickness of about 1 μm.

The method 300 continues at 306 with formation of contacts (e.g., contacts 114 and 118) through the PMD layer 111. FIG. 5 shows one example, in which a contact formation process 500 is performed that forms cylindrical contacts 114 and pre-metal trench contacts 118 through the PMD layer 111 and on the semiconductor layer 101. In one example, the process 500 includes patterned etching (not shown) to form cylindrical holes and trenches for the respective cylindrical and trench contacts, and one or more deposition steps that deposit suitable metal (e.g., that is or includes tungsten) in the openings, followed by a planarization step (e.g., chemical mechanical polishing or CMP) to provide a planar top side of the PMD layer 111 and the formed respective cylindrical contacts 114 and trench contacts 118. In one example, the trench formation creates a continuous trench for the pre-metal trench contact 118 that encircles a portion of the first region 196 (FIG. 1 above) of the PMD layer 111, and the corresponding trench and resulting contact 118 extends down onto the semiconductor layer 101 to begin the grounded conductive shield 105 described above. In the example implementation, the cylindrical pre-metal level contacts 114 are electrically coupled with one or more electronic circuit components of the electronic device 100 (e.g., for signal routing in the logic circuit 240 of FIG. 2). In addition, further trench contacts 118 are formed at 306 in the example of FIG. 5 in regions 119 (FIG. 1) near the outer periphery of the illustrated portion of the electronic device 100, for example, to provide protection against cracks and mechanical stress on the device 100 as well as provide a barrier against ingress from external ionic contamination at the die edge, although not a strict requirement of all possible implementations.

Figures 6, 7:
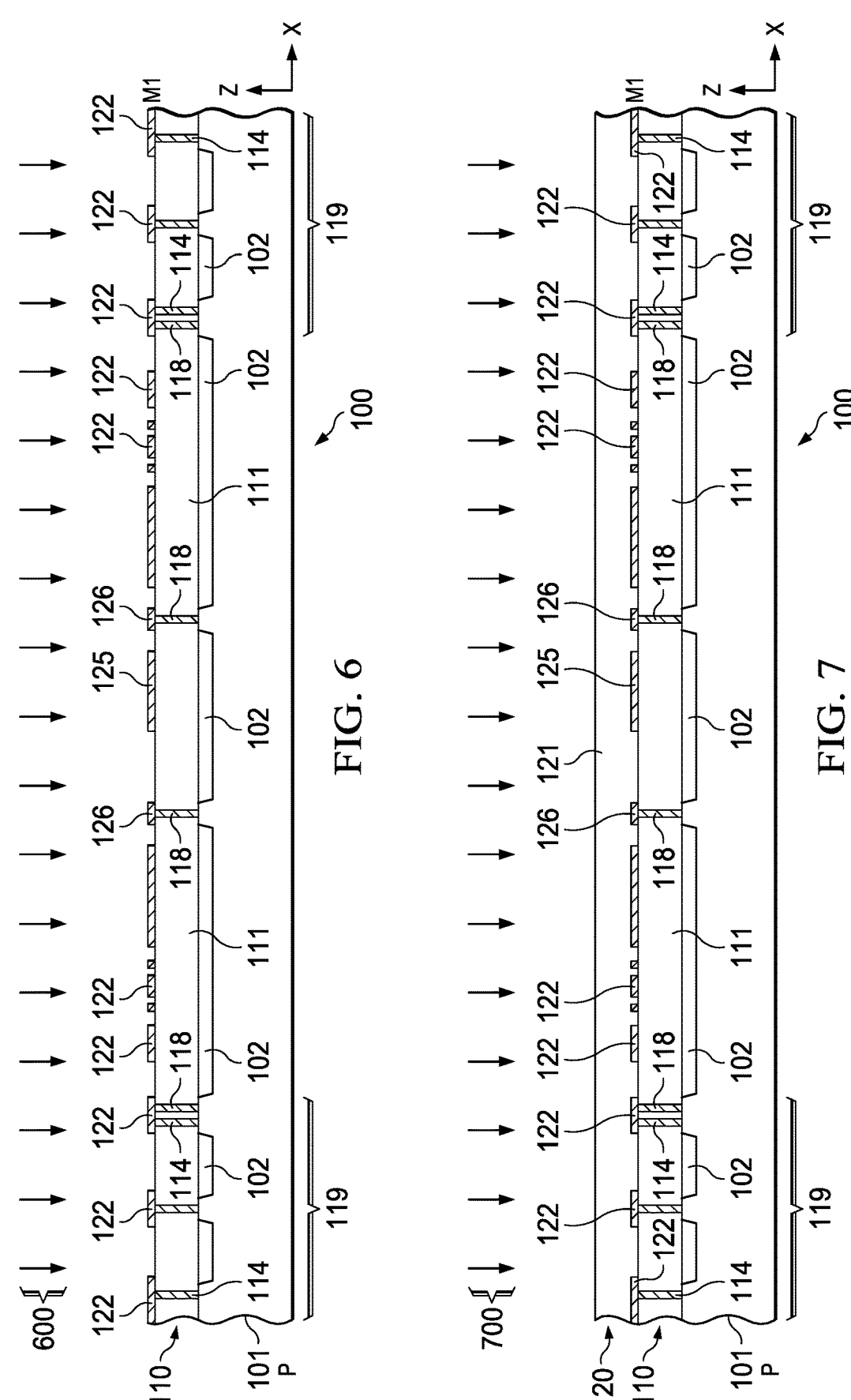

The method 300 continues at 310 in FIG. 3 with forming the metallization structure level 120 on the PMD layer 111. FIGS. 6 and 7 show an example implementation in which the first metallization structure level 120 is formed at 312 and 314 of FIG. 3. The metallization structure level 120 includes the metal routing lines 122 and first metal line 126 on the pre-metal trench contact 118 and the metal routing feature 125. In addition, the metallization structure level 120 includes the first ILD layer 121 on the PMD layer 111, the first metal line 126, and the metal routing feature 125, as well as the routing via 127 and the first trench via 128 on the first metal line 126. As discussed above, the first trench via 128 and the first metal line 126 encircle (except in the gap region where the metal routing feature 125 passes through the gap G as shown in FIG. 1C) the first region 196 at the first metallization structure level 120 within the second region 198 of the metallization structure level 120.

At 312 in FIG. 3, the first metal layer features (M1) are deposited and patterned. FIG. 6 shows one example, in which a process 600 is performed that deposits a metal layer on the PMD layer 111 (e.g., aluminum to a thickness of 0.57 μm), and etches exposed portions of the deposited metal using a patterned etch mask (not shown) to form the metal routing lines 122 in the second region (region 198 in FIG. 1 above), as well as the metal routing feature 125 and the first metal line 126 in the first region (196 in FIG. 1). At 314, the first ILD layer 121 is deposited on the PMD layer 111. FIG. 7 shows one example, in which a process 700 is performed that deposits and planarizes the first ILD layer 121 (e.g., silicon dioxide to a thickness over the first metal layer features of about 1.0 μm and a thickness over the PMD layer

111 of about 1.6 μm following planarization by chemical mechanical polishing (CMP)) on the PMD layer 111.

Figures 8, 9:
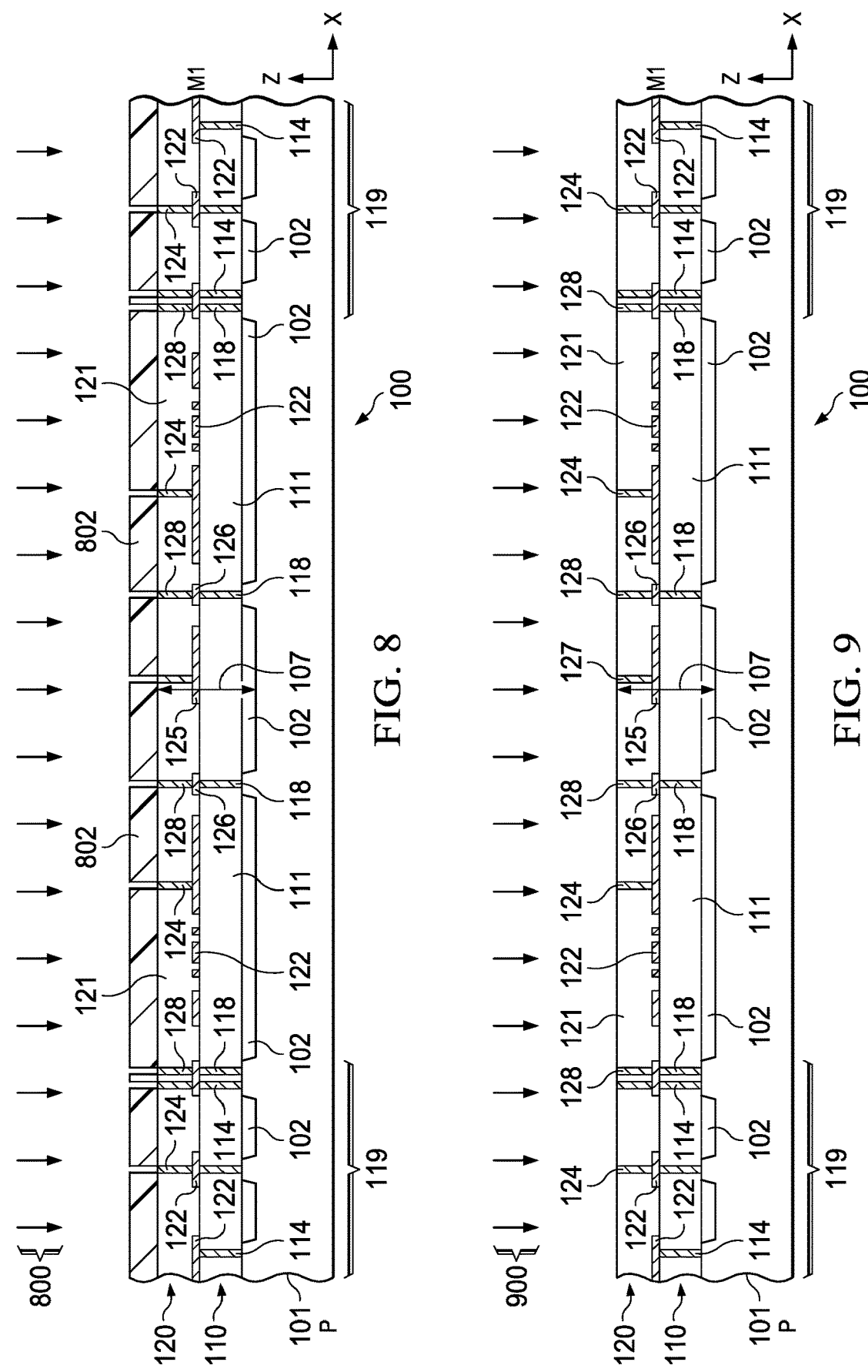

At 316 in FIG. 3, via openings (e.g., trenches and cylindrical holes) are etched in the deposited first ILD layer 121. FIG. 8 shows one example, in which an etch process 800 is performed using a patterned etch mask 802. The etch process 800 in one example forms cylindrical holes for prospective vias and trenches for prospective trench vias. The processing at 316 also includes filling the etched cylindrical holes and trenches with conductive metal (e.g., tungsten) to form the cylindrical routing vias 124 and the trench via 128. FIG. 9 shows one example, in which a deposition process 900 is performed that deposits tungsten in the etched via holes and trenches to form the cylindrical routing vias 124 and the first trench via 128 on the first metal line 126 to continue the conductive shield 105 in the metallization structure level 120. In one example, the processing at 310 in FIG. 3 also forms further first trench vias 128 in the regions 119 near the outer periphery of the illustrated portion of the electronic device 100, although not a strict requirement of all possible implementations. In one example, the processing at 310 also includes planarizing after the trenches in via holes are filled.

Figure 10:
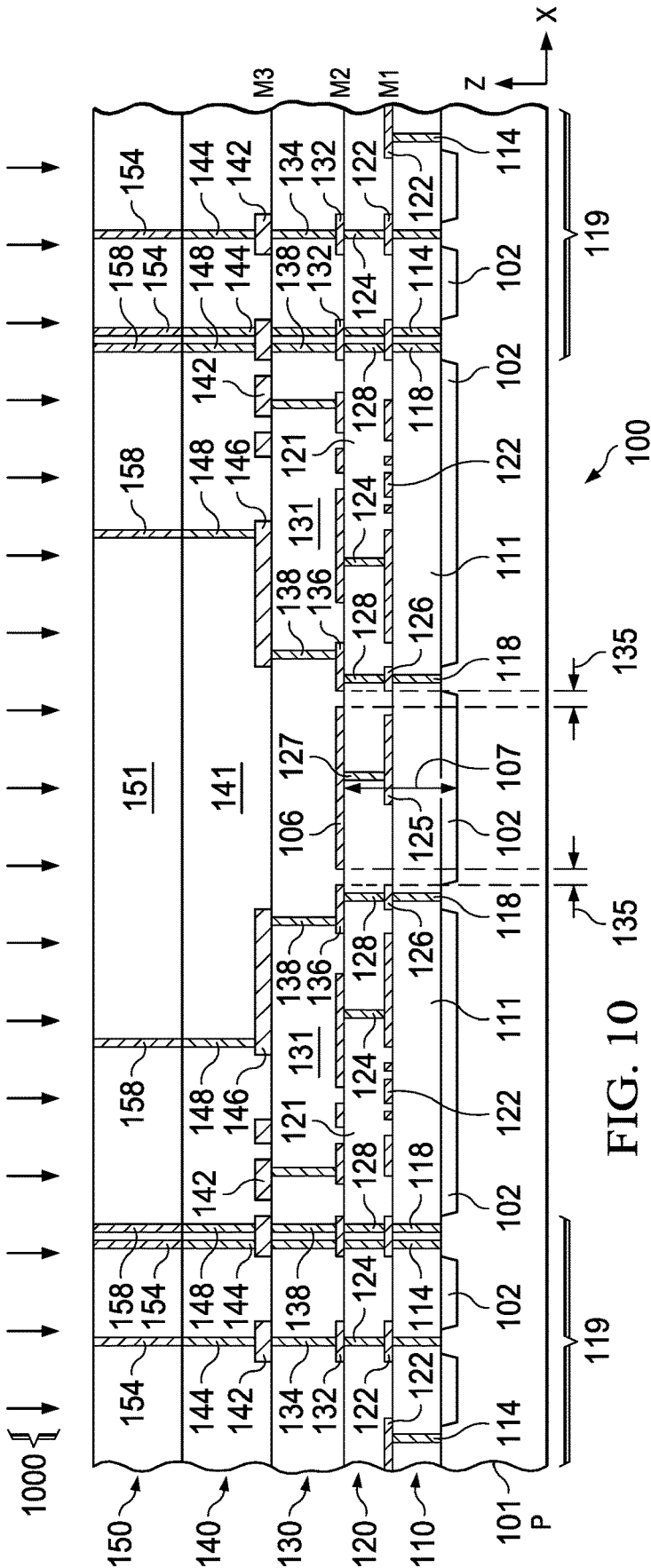

The method 300 continues at 320 in FIG. 3 with forming the metallization structure level 130 on the metallization structure level 120. One example includes forming and patterning the second metal layer (M2) at 322 to form the second metal line 136 on the first trench via 128, as well as to form the first terminal 106 of the capacitor 104 that is laterally spaced from the second metal line 136 by the gap distance 135, and that extends on at least a portion of the routing via 127 in the first portion of the multilevel metallization structure 103. FIG. 10 shows the example electronic device 100 after formation of the second metallization structure level 130 by processing 1000, as well as the respective metallization structure levels 140 and 150. At 324 in FIG. 3, the second ILD layer 131 is formed (e.g., silicon dioxide deposited and then planarized by CMP to a thickness of approximately 2.4 μm over the metal 2 features, or 2.4 μm+0.6 μm=3.0 μm over the first ILD layer 121) to extend on the first ILD layer, the second metal line 136, and the first terminal 106. At 326, trenches and cylindrical via holes are etched in the second ILD layer 131, and these are filled with tungsten to form the second trench via 138 on the second metal line 136 and the interconnection vias 134 and the second portion 198 of the multilevel metallization structure 103. In the illustrated example, the second metallization structure level processing at 320 also forms further trench vias 138 in the regions 119 near the outer periphery of the illustrated portion of the electronic device 100, although not a strict requirement of all possible implementations.

Figure 11:
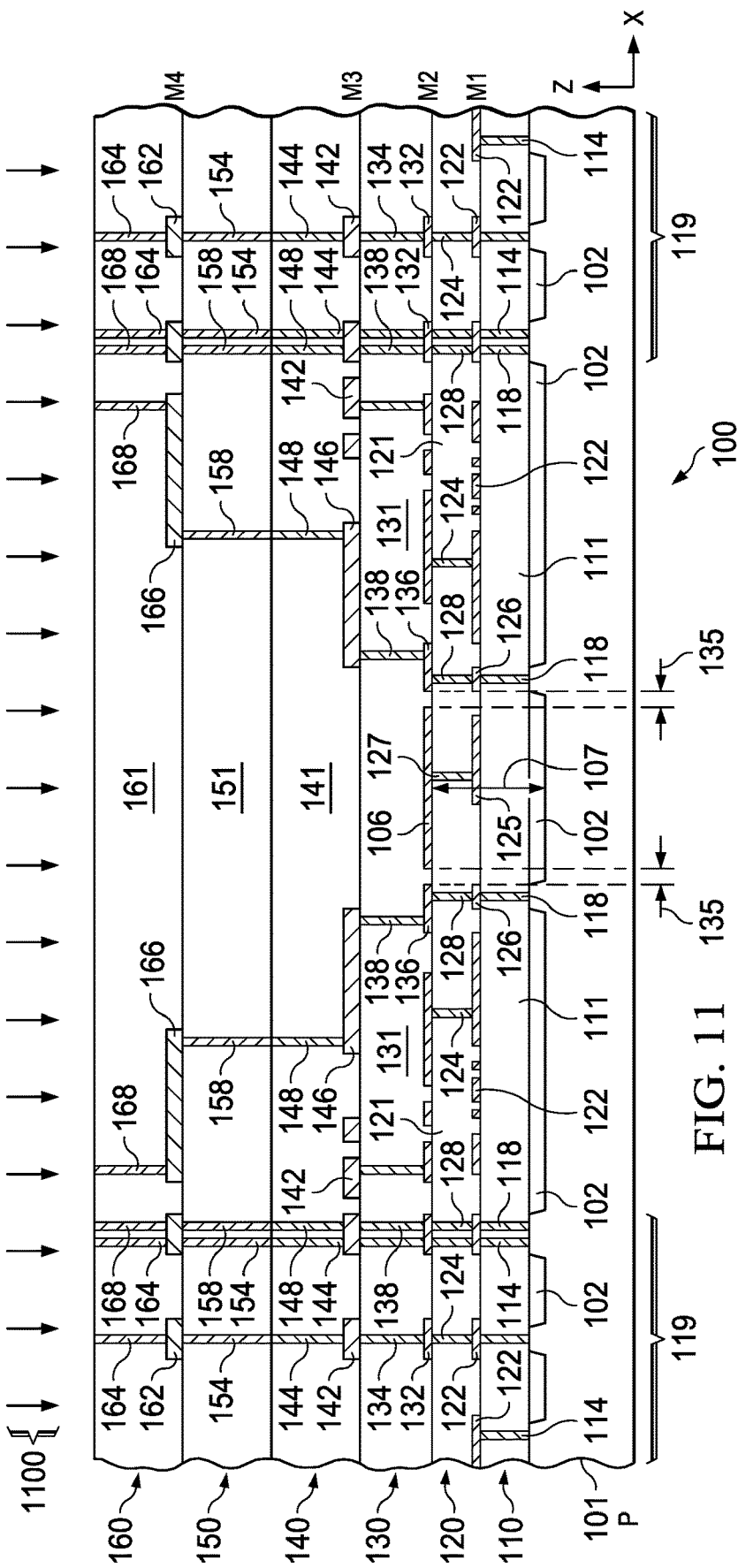

Further metallization structure levels are formed in one example at 330 in FIG. 3. FIG. 10 further shows the metallization structure level 140 on the metallization structure level 130 described above, as well as processing 1000 that forms the metallization structure level 150 with the stacked tungsten vias 154 and 158. Any number of intermediate metallization structure levels can be formed at 330, some of which may include respective metal lines, and each of which includes conductive vias such as the trench vias that encircle the first portion 196 of the multilevel metallization structure 103 in forming the staircase shaped conductive shield 105. In the illustrated example, the individual metallization structure levels are created by first depositing and patterning a metal line layer (if included, omitted for the levels 150 and 170 in the illustrated example), as well as depositing an ILD layer, chemical-mechanical polishing the ILD layer to remove topography, etching cylindrical via holes and trenches in the ILD layer, and filling the holes and trenches with tungsten, followed by chemical mechanical polishing (e.g., CMP) to remove unwanted tungsten from the ILD surface. FIG. 11 shows processing 1100 (e.g., at 330 in FIG. 3) that forms the example metallization structure level 160 in the electronic device 100.

Figure 12:
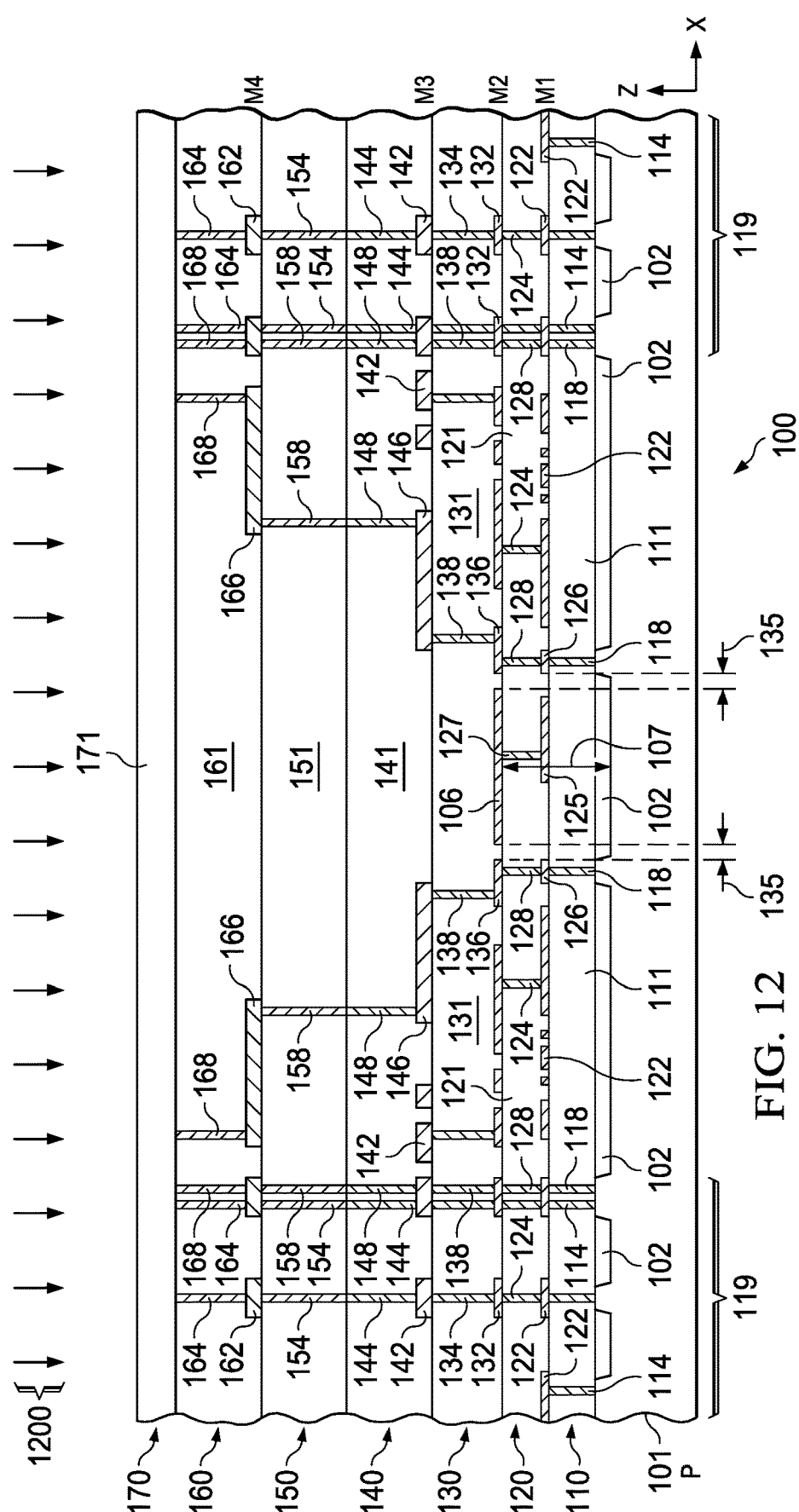
Figure 13:
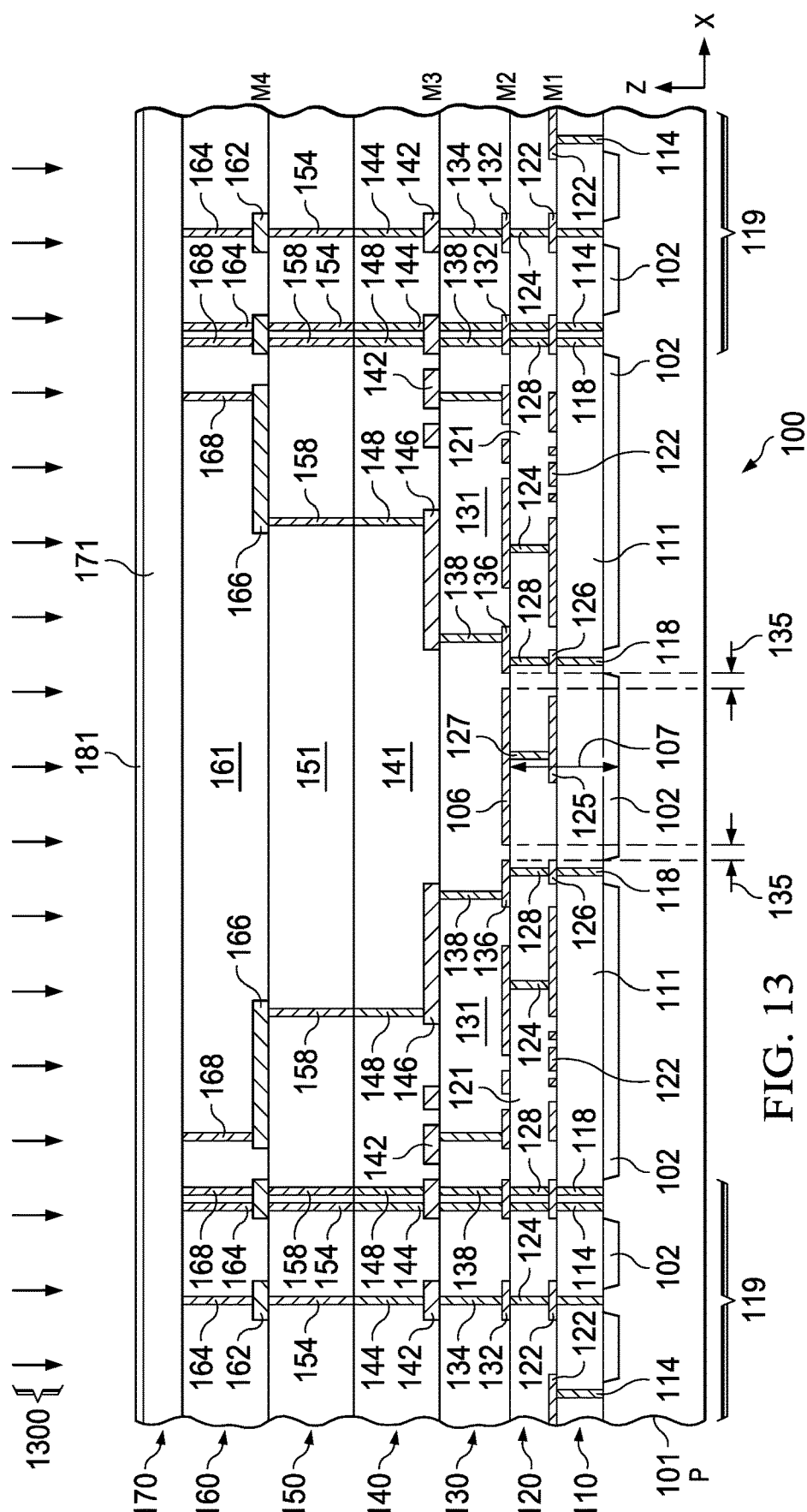
Figure 14:
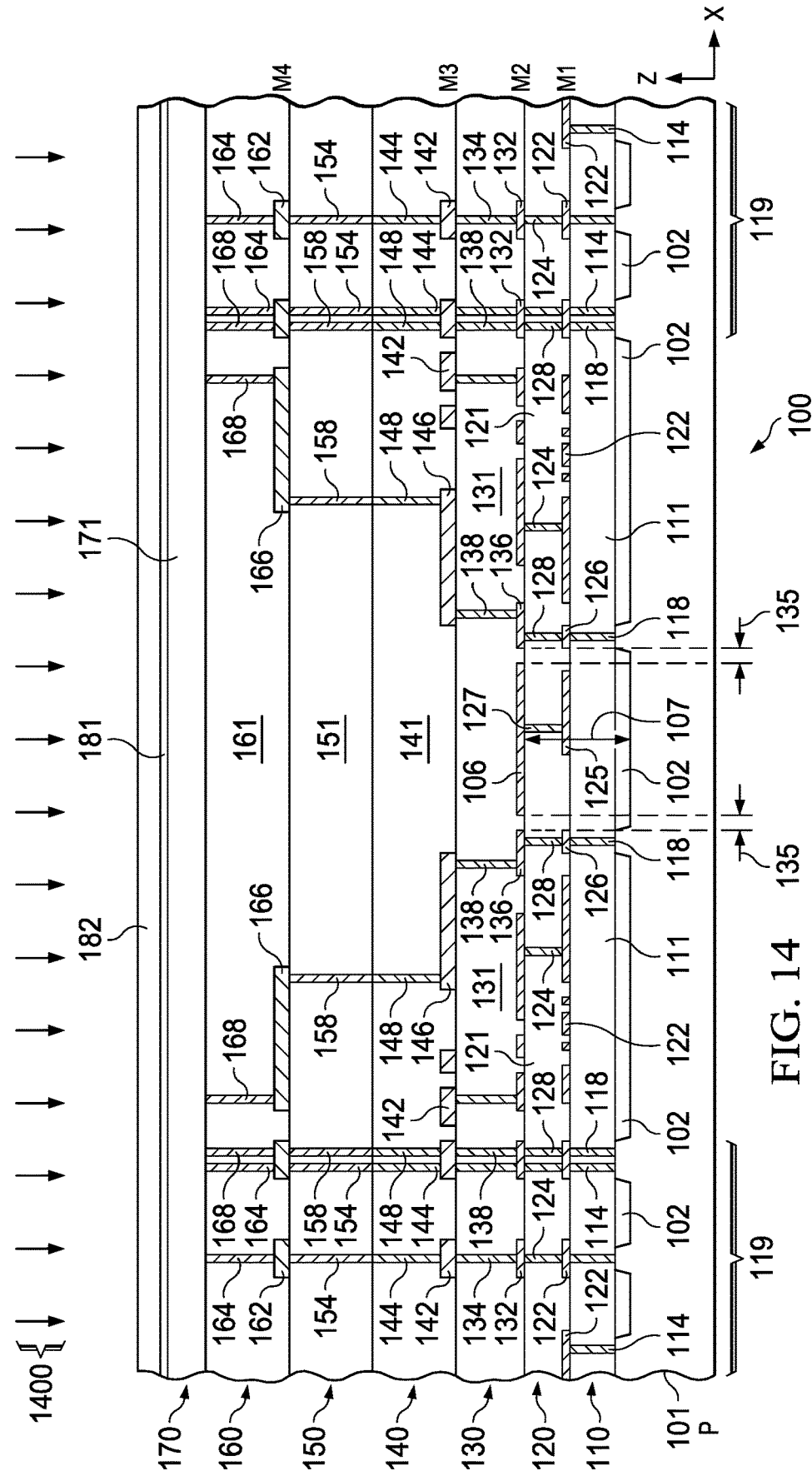
Figure 15:
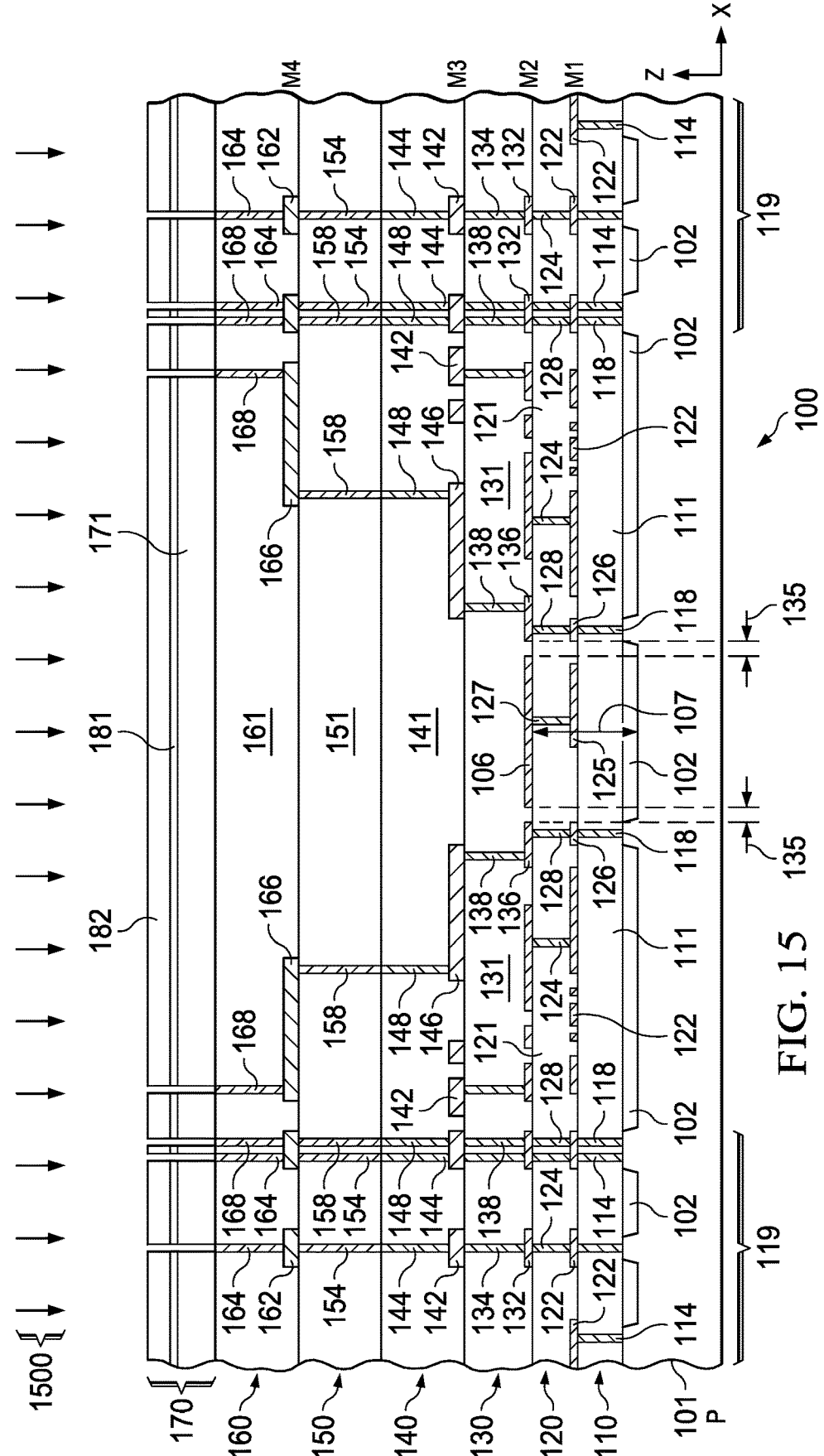
Figure 16:
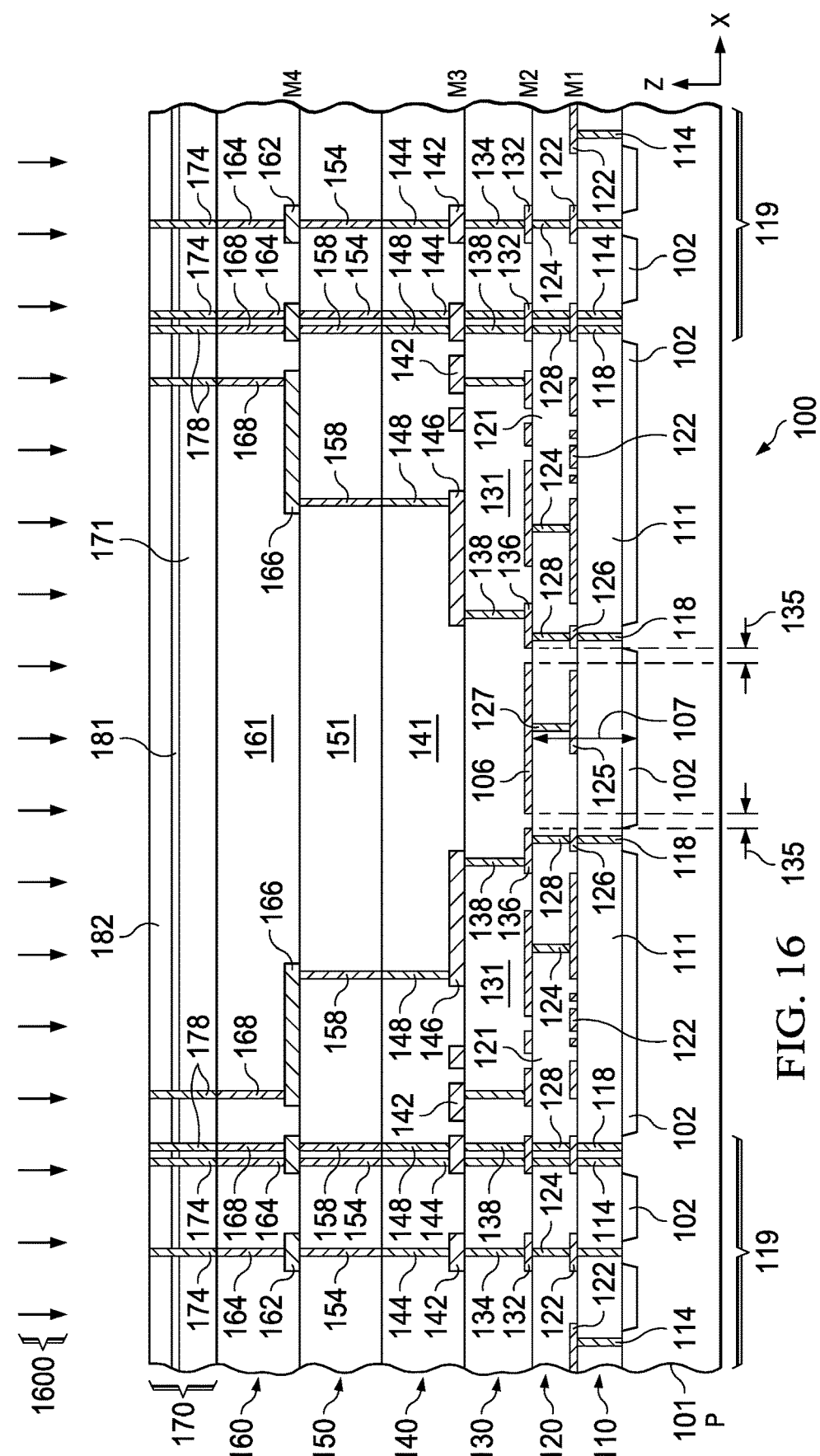

Fabrication of the metallization structure levels 170 and 180 (at 330 and 340 in FIG. 3) is illustrated in FIGS. 12-22, including a process 1200 in FIG. 12 that deposits and patterns the sixth metal line 176, the sixth level portion of the scribe seal stack 172, and any other sixth metal routing lines between them (not shown), and deposits the sixth ILD layer 171 over the preceding fifth ILD layer 161. FIGS. 13 and 14 show further deposition processing 1300 and 1400 that form the respective dielectric layers 181 and 182 of the SO bilayer. The deposition process 1300 in FIG. 13 in one example deposits silicon oxynitride 181 to a thickness of approximately 0.3 μm, and the deposition process 1400 in FIG. 14 deposits the silicon nitride layer 182 to a thickness of approximately 0.65 μm. FIG. 15 shows a process 1500 that forms trenches and cylindrical via holes through the layers 171, 181, and 182 (e.g., patterned etching using an etch mask, not shown), and FIG. 16 shows a process 1600 that fills the holes and trenches with tungsten in the multilevel metallization structure 103.

Figure 17:
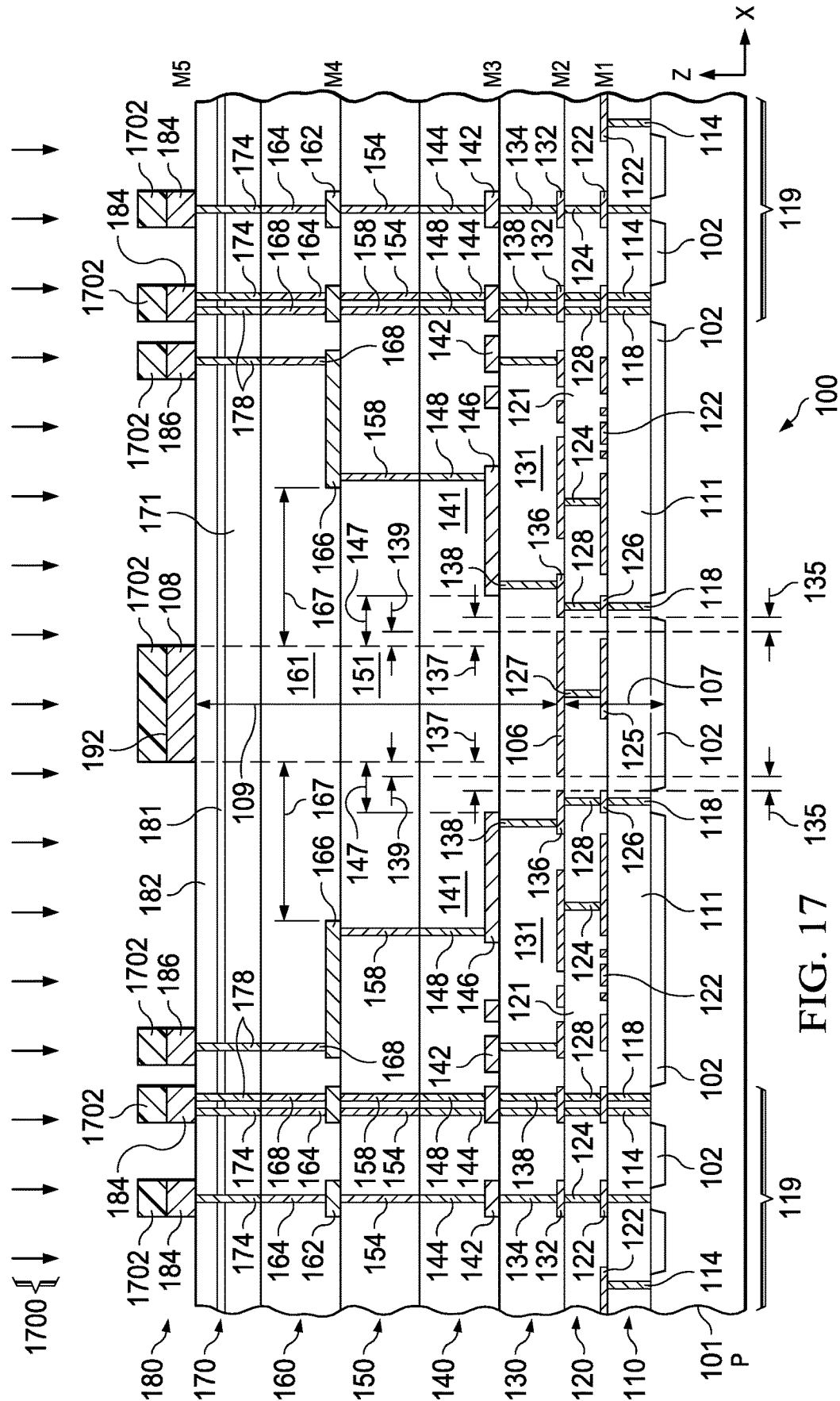
Figure 18:
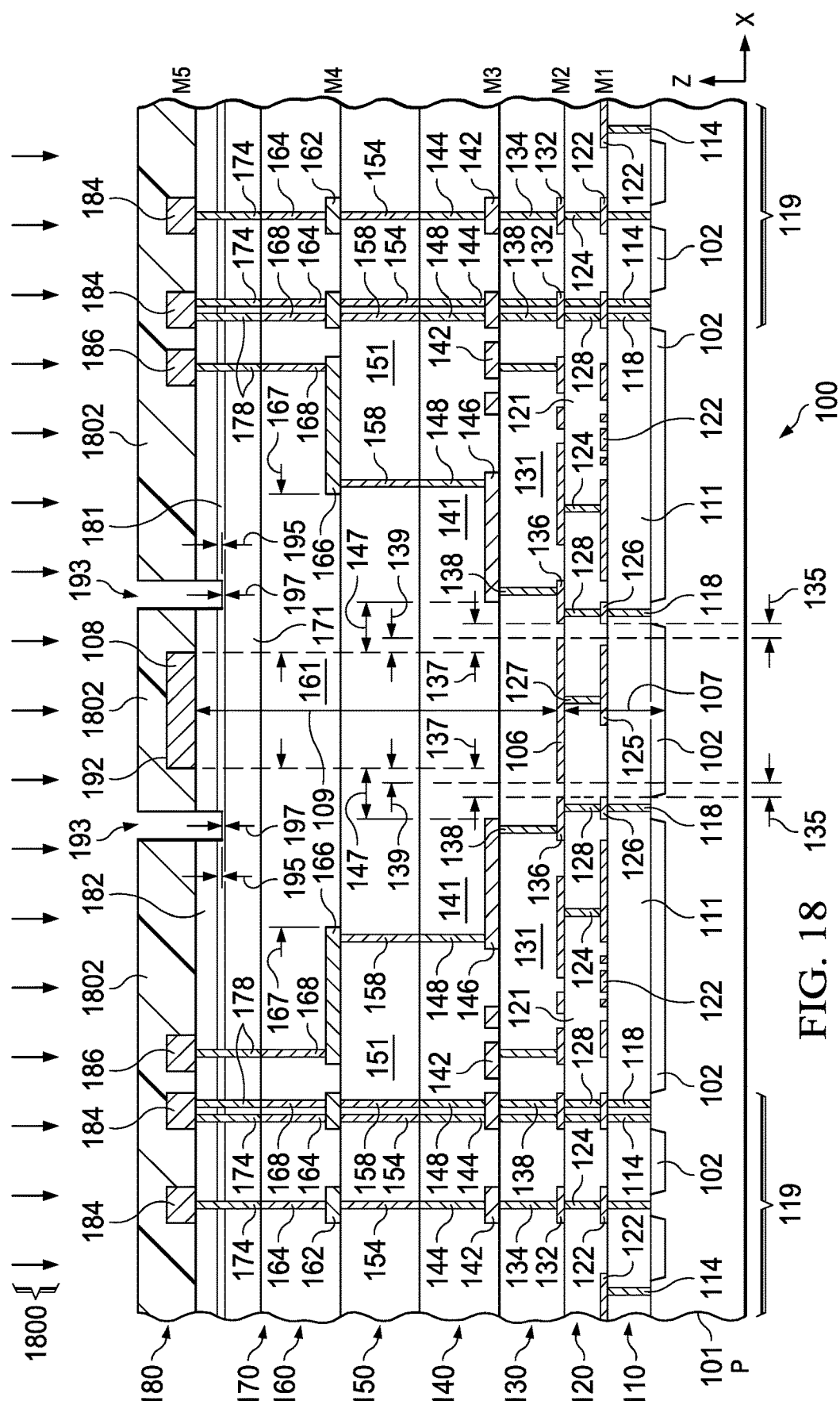
Figure 19:
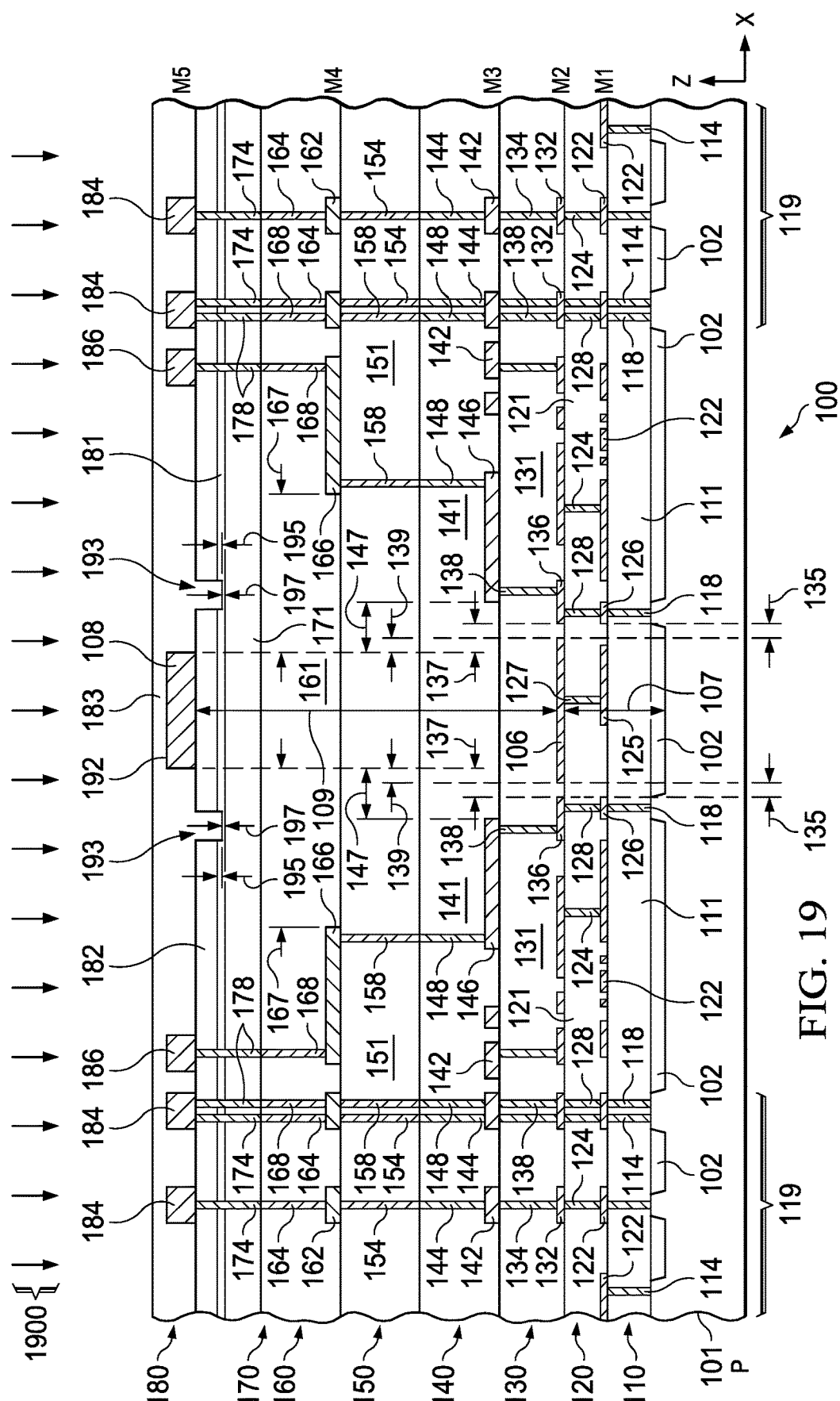

FIG. 17 illustrates an etch process 1700 after deposition of the top metallization layer with an etch mask 1702 that etches exposed portions of the top metallization layer to form the second terminal 108 and metal lines 184 and 186. Formation of the metallization structure level 180 continues in FIG. 18 with etch processing 1800 using a mask 1802 that etches the layers 182 and 181 to create the trench 193 that extends through the layer 182 and stops in the layer 181. A portion of the protective overcoat stack 189 is deposited by a sequence of deposition processes 1900 in FIG. 19 (e.g., silicon dioxide with a thickness of 1.5 μm deposited by high density plasma (HDP) followed by silicon dioxide deposition to a thickness of 3.6 μm by plasma enhanced chemical deposition (PECVD). The SO bilayer deposited by the process sequence 1900 is then chemically mechanically polished to within 1.4 μm of the metallization structure level 180 to remove topography in one example.

Figure 20:
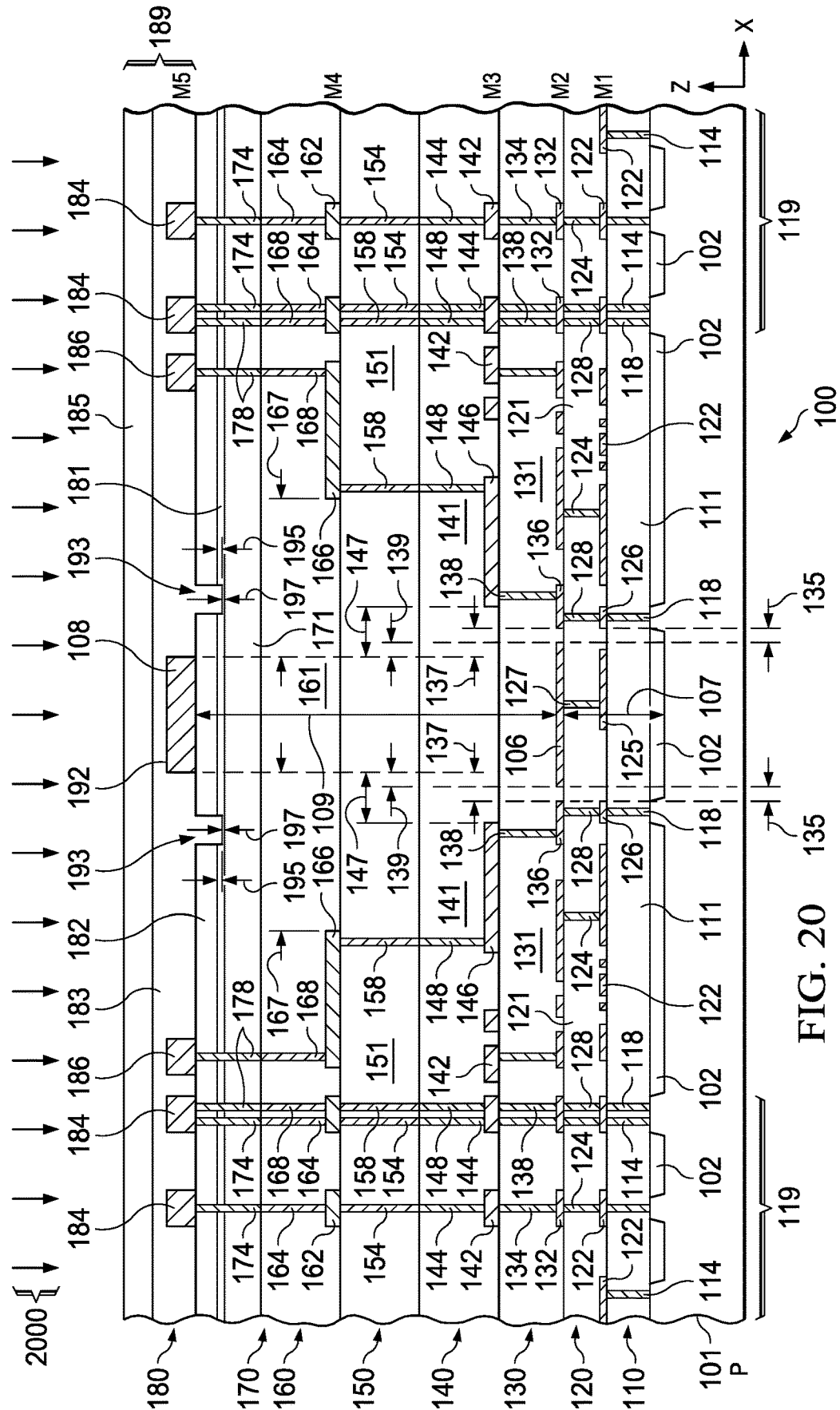
Figure 21:
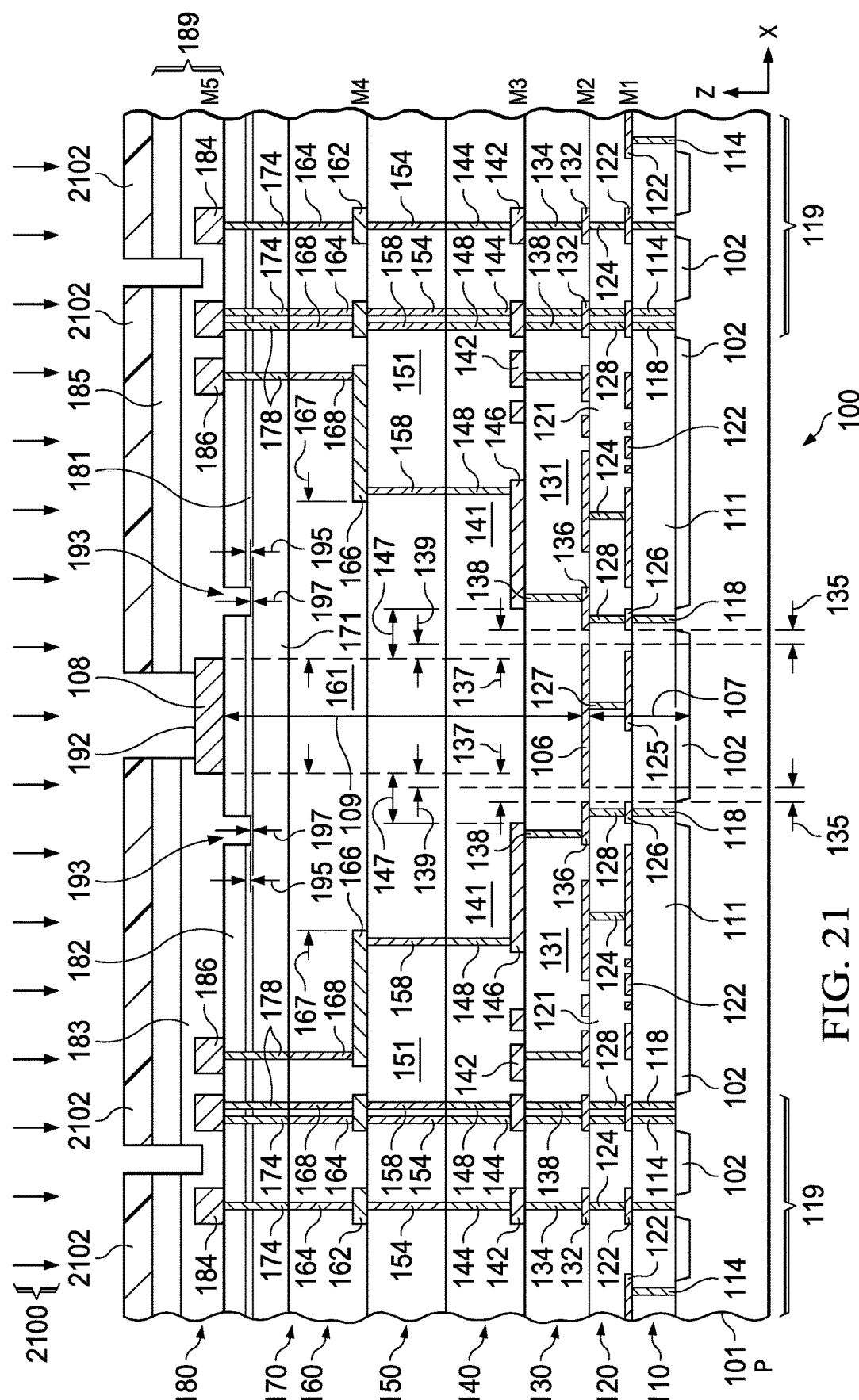
Figure 22:
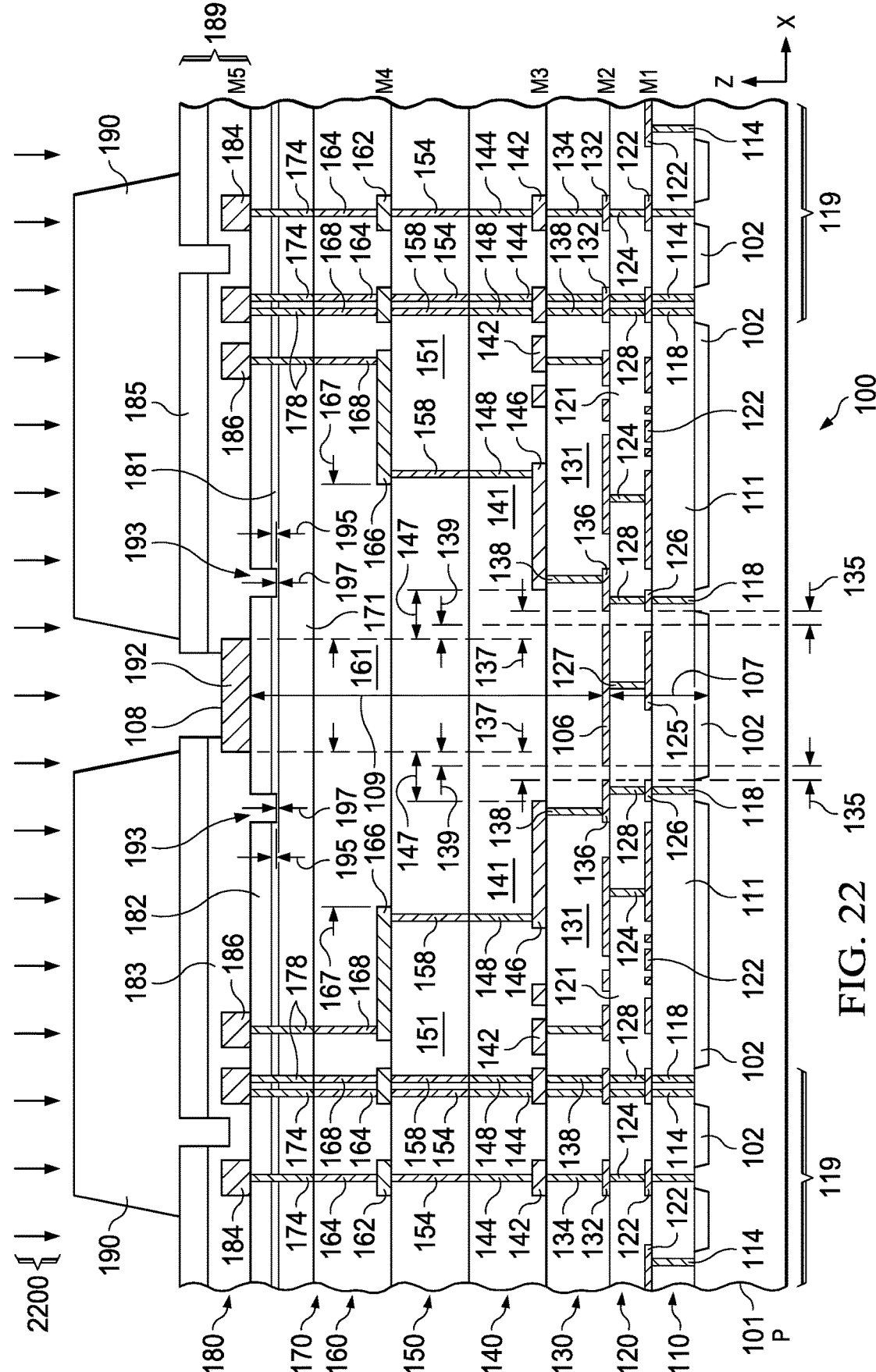

In FIG. 20, a deposition process 2000 is performed that deposits a dielectric layer 185 that, together with the dielectric layer 183, forms the protective overcoat stack 189 for the electronic device 100. In one example, the process 2000 deposits the dielectric layer 185 as silicon oxynitride to a thickness of approximately 2.8 μm. In FIG. 21, an etch process 2100 is performed with an etch mask 2102. The etch process 2100 etches openings in the protective overcoat stack 189, including an opening that exposes the top side 192 of the second terminal 108 of the capacitor 104. In FIG. 22, a dispense or screening process 2200 is performed that forms the polyimide layer 190 (e.g., to a thickness of approximately 10 μm) over portions of the protective overcoat stack 189 to create a stress barrier to mitigate mechanical stress at the surface of the dielectric layer 185 of the protective overcoat stack 189. As shown in FIG. 22, the polyimide layer 190 has a gap that exposes the top side 192 of the second terminal 108.

Figure 23:
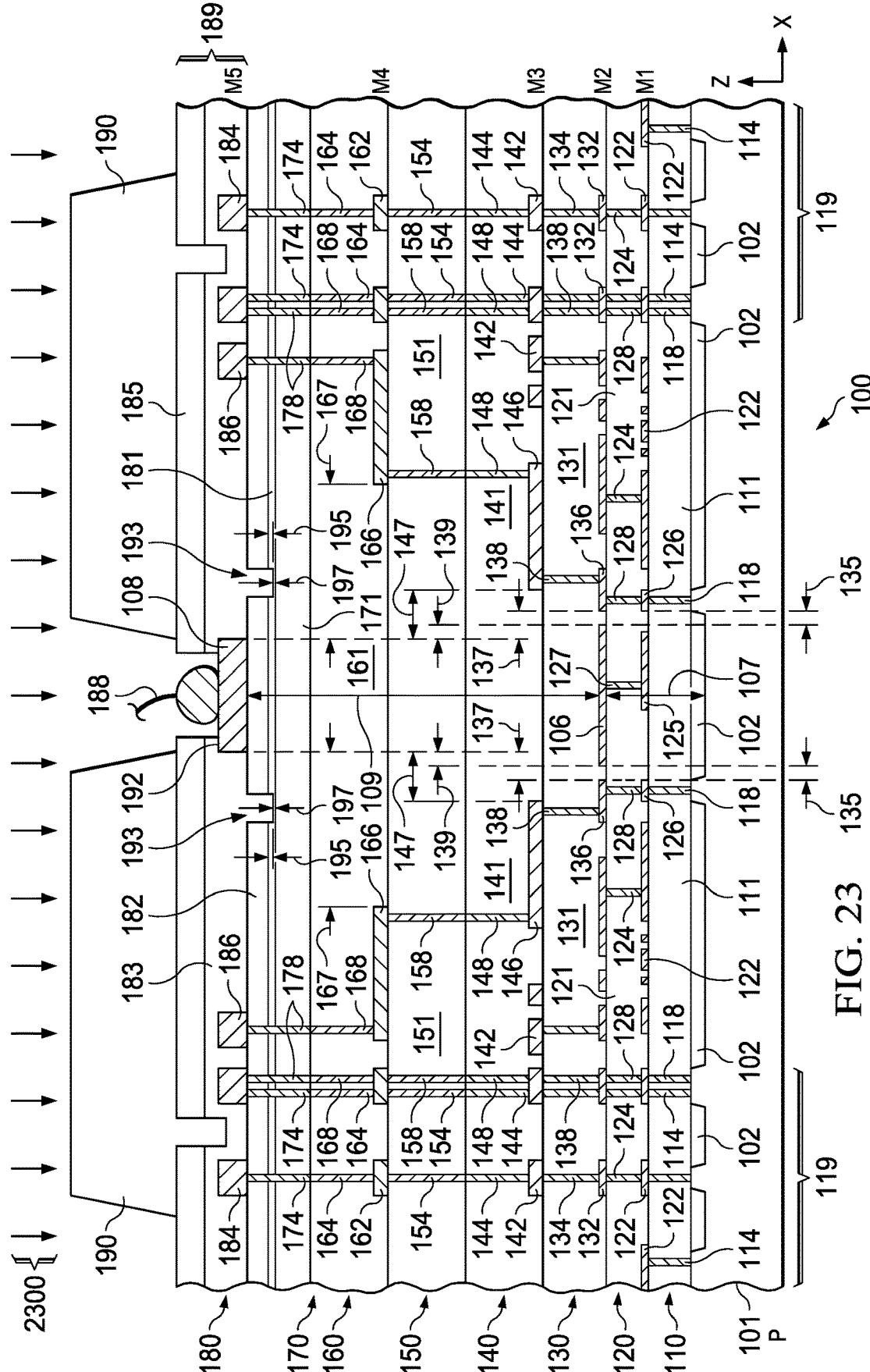
Figure 24:
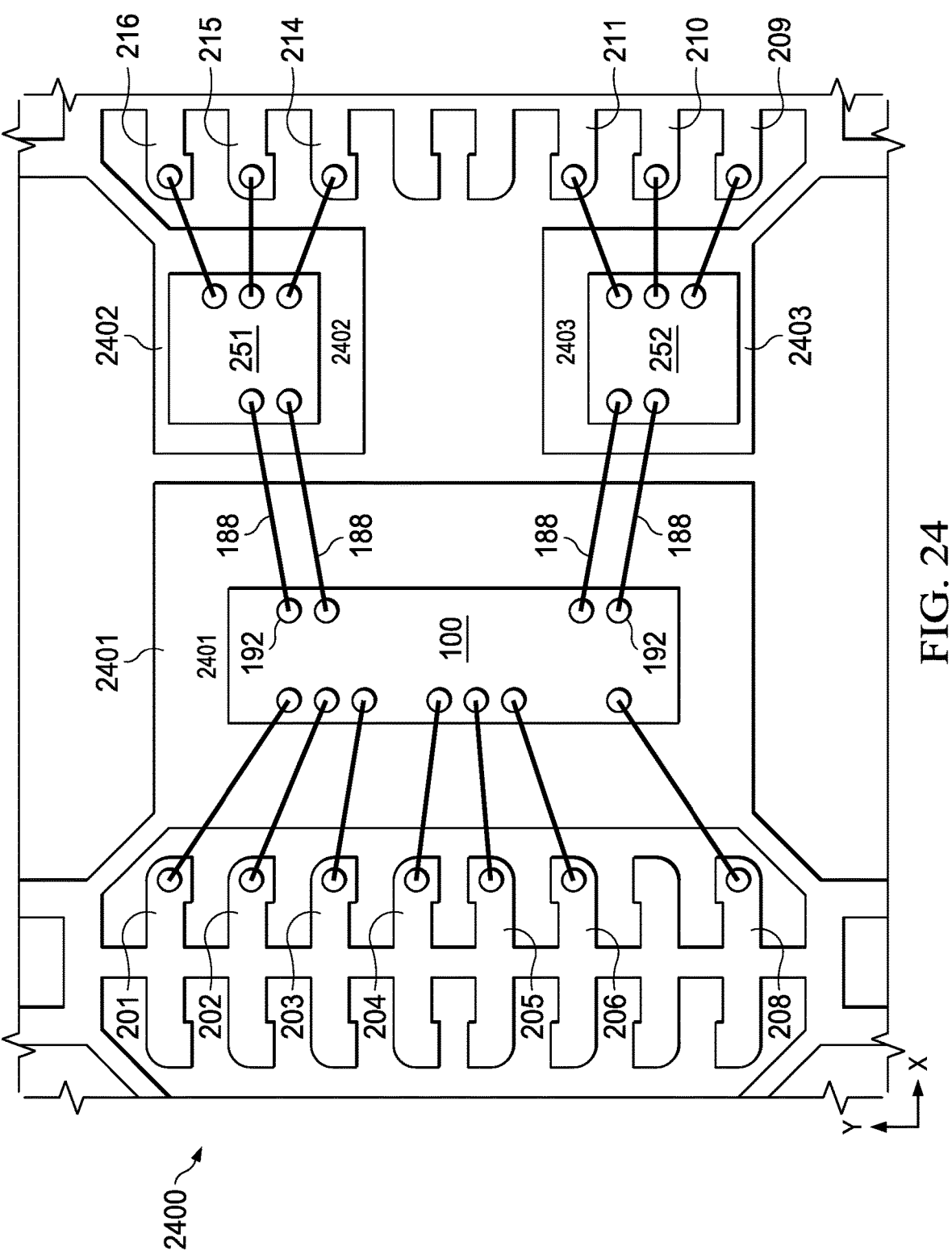
FIG. 24 is a partial top plan view showing a portion of a lead frame with attached semiconductor dies after undergoing wire bonding.
Figure 25:
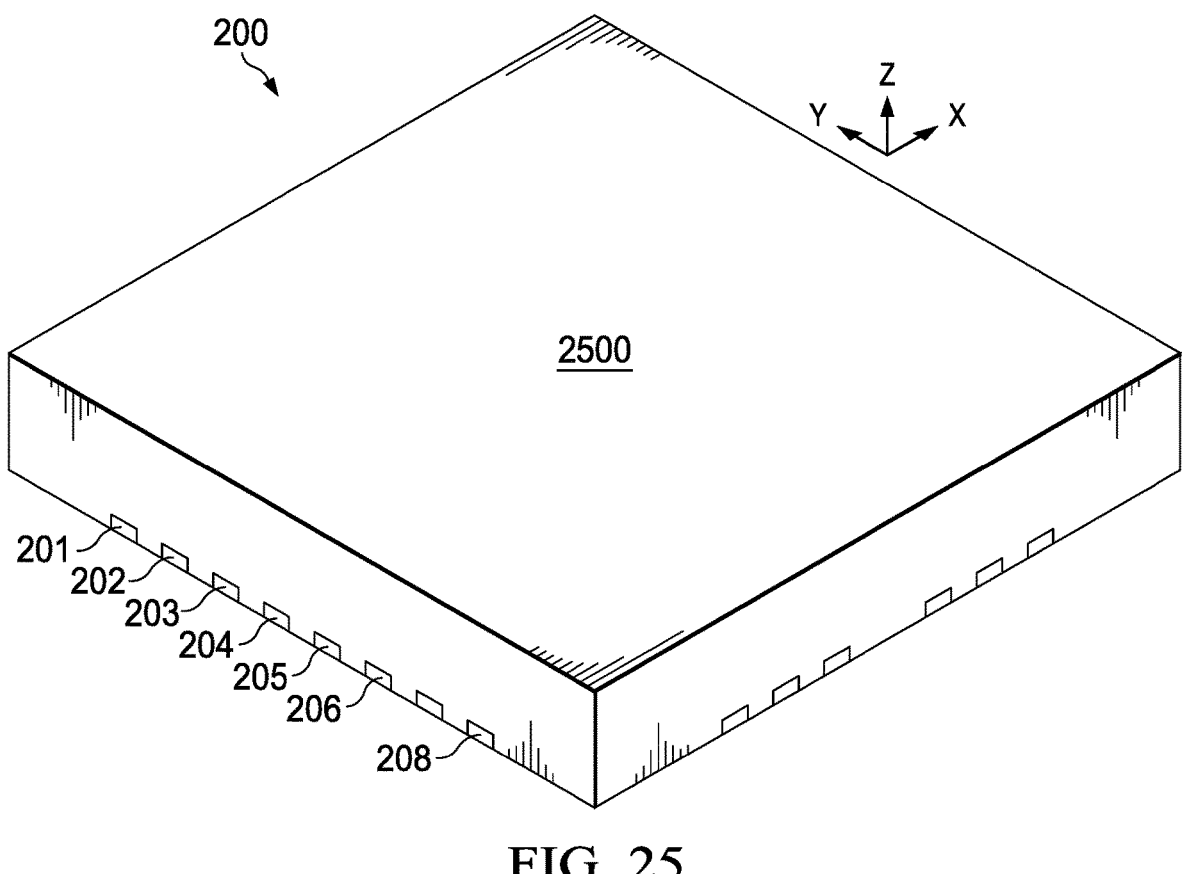
FIG. 25 is a perspective view of a packaged electronic device.

Referring also to FIGS. 23-25, the method 300 continues at 350 with separating a first semiconductor die (e.g., the electronic device 100 in FIG. 2 above) including the semiconductor layer 101 and the multilevel metallization structure 103 from a wafer. In addition, the die is attached to a lead frame and wire bonding processing is performed at 350 via processing 2300 in FIG. 23 to provide electrical connection to the second capacitor terminal 108. FIGS. 23 and 24 show a packaged electronic device during processing at 350, in which the electronic device 100 is attached (FIG. 24) to a first die attach pad 2401 of a lead frame structure 2400 having the leads or terminals 201-206, 208-211 and 214-216 as previously described. The die attach processing at 350 in this example also includes attaching the dies 251 and 252 (e.g., FIG. 2 above) to respective die attach pads 2402 and 2403 of the lead frame. Bond wires are connected (e.g., welded, ultrasonically bonded, etc.) between conductive features of the dies 100, 251, 252 and/or to specific ones of the leads 201-206, 208-211 and 214-216. As shown in FIGS. 2, 23, and 24, the wire bonding also bonds the bond wires 188 to the exposed top side 192 of the respective second terminal 108 of the capacitor 104. In this example, the second end of the bond wires 188 are respectively coupled to the corresponding second capacitor plates 108 of the dies 251 and 252 in order to create series connected capacitor coupling between the driver outputs of the electronic device 100 and the circuitry of the dies 251 and 252. Other electrical connection technologies can be used at 350, such as ball grid arrays or solder ball connections to conductive features of substrates, etc., to form an electrical connection at 350 between the second terminal 108 of the capacitor 104 and a conductive feature of a second semiconductor die.

The method 300 also includes molding and device separation at 360 in FIG. 3. FIG. 25 shows a molded and singulated packaged electronic device 200 including a molded package structure 2500 (e.g., molding compound) that encloses the dies 100, 251 and 252, the bond wires 188, and exposes portions of the conductive leads or terminals 201, 202, 203, 204, 205, 206, 208 along one or more sides of the package structure 2500. The example of FIG. 25 is a quad flat no lead (QFN) packaged device 200. In another example, different package types and forms are possible, and the method 300 in one example also includes lead trimming and forming to provide finished packaged electronic devices with gull-wing leads, J-type leads, etc.

Figure 26:
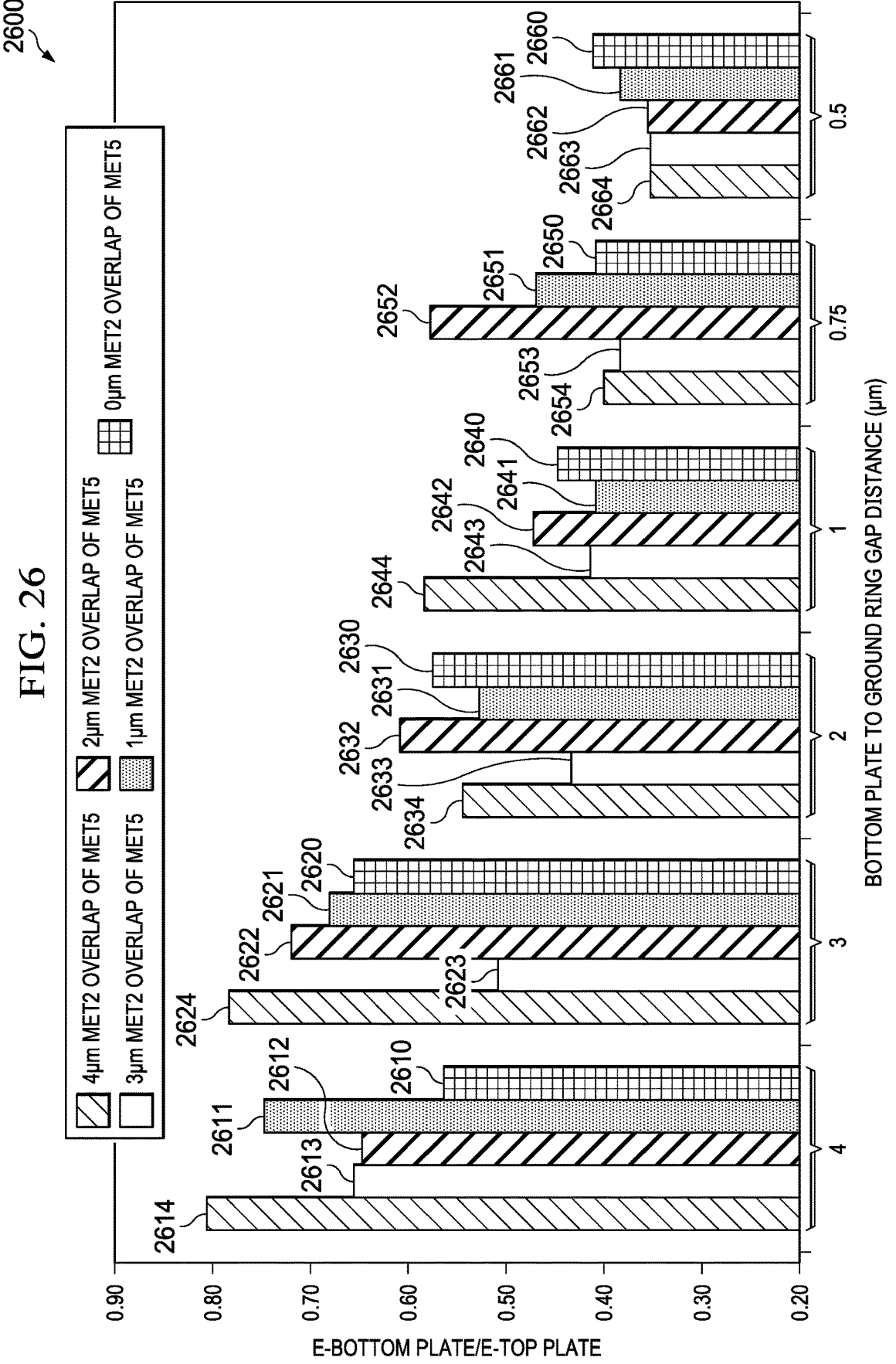
FIG. 26 is a graph of bottom to top plate electric field ratio as a function of bottom plate to ground ring distance of an integrated Faraday shield for various cases of bottom to top plate overlap amount.

FIG. 26 shows a graph 2600 of bottom to top plate electric field ratio for different bottom to top plate overlap distances 139 and bottom plate to a ground ring gap distance 135 of an integrated conductive shield 105. The examples show advantages in controlling the distances 135 and 139 to reduce the ratio of the bottom plate E-field to the top plate E-field below 0.5 to mitigate dielectric breakdown in the electronic devices 100, 200. A first group of simulated data 2610-2614 represents ratios for a gap distance 135 of 4 μm and includes a value 2610 for an overlap distance 139 of 0 μm, a value 2611 for an overlap distance 139 of 1 μm, a value 2612 for an overlap distance 139 of 2 μm, a value 2613 for an overlap distance 139 of 3 μm, and a value 2614 for an overlap distance 139 of 4 μm. A second group of simulated data 2620-2624 represents ratios for a gap distance 135 of 3 μm and includes a value 2620 for an overlap distance 139 of 0 μm, a value 2621 for an overlap distance 139 of 1 μm, a value 2622 for an overlap distance 139 of 2 μm, a value 2623 for an overlap distance 139 of 3 μm, and a value 2624 for an overlap distance 139 of 4 μm. A third group of simulated data 2630-2634 represents ratios for a gap distance 135 of 4 μm and includes a value 2630 for an overlap distance 139 of 2 μm, a value 2631 for an overlap distance 139 of 1 μm, a value 2632 for an overlap distance 139 of 2 μm, a value 2633 for an overlap distance 139 of 3 μm, and a value 2634 for an overlap distance 139 of 4 μm. A fourth group of simulated data 2640-2644 represents ratios for a gap distance 135 of 1 μm and includes a value 2640 for an overlap distance 139 of 0 μm, a value 2641 for an overlap distance 139 of 1 μm, a value 2642 for an overlap distance 139 of 2 μm, a value 2643 for an overlap distance 139 of 3 μm, and a value 2644 for an overlap distance 139 of 4 μm. A fifth group of simulated data 2650-2654 represents ratios for a gap distance 135 of 0.75 μm and includes a value 2650 for an overlap distance 139 of 0 μm, a value 2651 for an overlap distance 139 of 1 μm, a value 2652 for an overlap distance 139 of 2 μm, a value 2653 for an overlap distance 139 of 3 μm, and a value 2654 for an overlap distance 139 of 4 μm. A sixth group of simulated data 2660-2664 in FIG. 26 represents ratios for a gap distance 135 of 0.55 μm and includes a value 2660 for an overlap distance 139 of 0 μm, a value 2661 for an overlap distance 139 of 1 μm, a value 2662 for an overlap distance 139 of 2 μm, a value 2663 for an overlap distance 139 of 3 μm, and a value 2664 for an overlap distance 139 of 4 μm. The graph 2600 identifies an example implementation, for example, with the gap distance 135 of 0.5 μm to 1.0 μm, such as 0.55 μm to 0.75 μm, and the overlap distance 139 of 1.0 μm to 6.0 μm, such as 2.0 μm to 5.0 μm, for example, approximately 3 μm to reduce the bottom plate Epk and improve the isolation capability of single die reinforced devices. In one example, the benefits can be enhanced using a gap distance 135 of approximately 0.55 μm and an overlap distance 139 of approximately 3 μm. Described examples provide solutions by implementation of dual design rules for the bottom plate overlap distance 139 and the gap distance 135 for controlling the space between the first terminal 106 and the ground ring to reduce the bottom plate Epk. The use of the SO bilayer 181, 182 with or without the trench 193 provides further benefits to reduce the Epk at or near the top plate 108.

Some test devices formed using these parameters have been found to have a significantly greater bipolar surge capacity than analogous baseline devices. For example, compared to baseline devices having gap distance 135 of 4 μm, devices having gap distance 135 of 0.55 μm have a bipolar surge capacity more than 10% greater. (Testing conducted as per EC/EN 61000-4-2 standard, voltage at 50% failure rate.) This improvement provides significantly improved margin over the 8 kV minimum surge voltage specified by level 4 of the EC/EN 61000-4-2 standard, resulting in increased device lifetime and improved safety to end users.

Unless otherwise stated, "about," "approximately," or "substantially" preceding a value means +/−10 percent of the stated value. The above examples are merely illustrative of several possible implementations of various aspects of the present disclosure, wherein equivalent alterations and/or modifications will occur to others skilled in the art upon reading and understanding this specification and the annexed drawings. Modifications are possible in the described examples, and other implementations are possible, within the scope of the claims.

What is claimed is:

1. An electronic device, comprising:
a multilevel metallization structure over a semiconductor layer, the multilevel metallization structure having a first region, a second region, a pre-metal level over the semiconductor layer, and metallization structure levels over the pre-metal level, the pre-metal level and the metallization structure levels extending in respective planes of orthogonal first and second directions and arranged in a stack along a third direction that is orthogonal to the first and second directions, and the metallization structure levels including a first metallization structure level and a second metallization structure level;

a capacitor in the first region of the multilevel metallization structure, the capacitor having a first terminal and a second terminal, the first terminal forming a first capacitor plate in the first metallization structure level, the second terminal forming a second capacitor plate in the second metallization structure level, and the first terminal overlapping the second terminal by an overlap distance in the first and second directions, the overlap distance being 1.0 μm to 6.0 μm; and a conductive shield between the first region and the second region in the multilevel metallization structure, the conductive shield having interconnected metal lines and vias in the respective metallization structure levels that at least partially encircle the first region of the multilevel metallization structure, the conductive shield electrically connected to the semiconductor layer, the conductive shield including a first metal line that encircles the first terminal in the first metallization structure level, the first metal line spaced apart from the first terminal by a gap distance in the first and second directions, the gap distance being at least 0.5 μm and less than 1.0 μm.

2. The electronic device of claim 1, wherein the overlap distance is 2.0 μm to 5.0 μm.

3. The electronic device of claim 2, wherein the gap distance is 0.55 μm to 0.75 μm.

4. The electronic device of claim 1, wherein the gap distance is 0.55 μm to 0.75 μm.

5. The electronic device of claim 1, further comprising a bilayer structure in one of the metallization structure levels, the bilayer structure having a silicon oxynitride layer and a silicon nitride layer on the silicon oxynitride layer, the second terminal on a portion of the silicon nitride layer.

6. The electronic device of claim 5, further comprising a trench in the bilayer structure, the trench spaced laterally outward from the second terminal in the first and second directions, the trench extending through the silicon oxynitride layer along the third direction, the trench extending partially into the silicon oxynitride layer along the third direction, and the trench filled with dielectric material of the second metallization structure level.

7. The electronic device of claim 1, further comprising a transistor over or in the semiconductor layer.

8. A packaged electronic device, comprising:

a semiconductor die, including:

a semiconductor layer;

a multilevel metallization structure over the semiconductor layer, the multilevel metallization structure having a first region, a second region, a pre-metal level on the semiconductor layer, and metallization structure levels over the pre-metal level, the pre-metal level and the metallization structure levels extending in respective planes of orthogonal first and second directions and arranged in a stack along a third direction that is orthogonal to the first and second directions, and the metallization structure levels including a first metallization structure level and a second metallization structure level;

a capacitor in the first region of the multilevel metallization structure, the capacitor having a first terminal and a second terminal, the first terminal forming a first capacitor plate in the first metallization structure level, the second terminal forming a second capacitor plate in the second metallization structure level; and, the first terminal overlapping the second terminal by an overlap distance in the first and second directions, the overlap distance being 1.0 μm to 6.0 μm, the second terminal including an exposed side; and a conductive shield between the first region and the second region in the multilevel metallization structure, the conductive shield having interconnected metal lines and vias in the respective metallization structure levels that at least partially encircle the first region of the multilevel metallization structure, the conductive shield coupled to the semiconductor layer, the conductive shield including a first metal line that encircles the first terminal in the first metallization structure level, the first metal line spaced apart from the first terminal by a gap distance in the first and second directions, the gap distance being at least 0.5 μm and less than 1.0 μm;

an electrical connection including an end bonded to the exposed side of the second terminal;

a package structure that encloses the semiconductor die and the electrical connection; and conductive leads exposed along one or more sides of the package structure.

9. The packaged electronic device of claim 8, further comprising a second semiconductor die, including a conductive feature, the electrical connection including a second end bonded to the conductive feature of the second semiconductor die, and the package structure enclosing the second semiconductor die.

10. The packaged electronic device of claim 8, wherein the overlap distance is 2.0 μm to 5.0 μm.

11. The packaged electronic device of claim 10, wherein the gap distance is 0.55 μm to 0.75 μm.

12. The packaged electronic device of claim 8, wherein the gap distance is 0.55 μm to 0.75 μm.

13. The packaged electronic device of claim 8, further comprising a bilayer structure on one of the metallization structure levels, the bilayer structure having a silicon oxynitride layer and a silicon nitride layer on the silicon oxynitride layer, the second terminal on a portion of the silicon nitride layer.

14. The packaged electronic device of claim 13, further comprising a trench in the bilayer structure, the trench spaced laterally outward from the second terminal in the first and second directions, the trench extending through the silicon oxynitride layer along the third direction, the trench extending partially into the silicon oxynitride layer along the third direction, and the trench filled with dielectric material of the second metallization structure level.

15. A method of forming an integrated circuit, comprising:

forming a multilevel metallization structure over a semiconductor layer, the multilevel metallization structure having: a first region; a second region; a capacitor in the first region; a pre-metal level on the semiconductor layer; metallization structure levels over the pre-metal level; and a conductive shield between the first region and the second region; the pre-metal level and the metallization structure levels extending in respective planes of orthogonal first and second directions and arranged in a stack along a third direction that is orthogonal to the first and second directions, and the metallization structure levels including a first metallization structure level and a second metallization structure level; the capacitor having a first terminal and a second terminal, the first terminal forming a first capacitor plate in the first metallization structure level, the second terminal forming a second capacitor plate in the second metallization structure level; the first terminal overlapping the second terminal by an overlap distance in the first and second directions, and the overlap distance being 1.0 μm to 6.0 μm; and the conductive shield having interconnected metal lines and vias in the respective metallization structure levels that at least partially encircle the first region of the multilevel metallization structure, the conductive shield coupled to the semiconductor layer, the conductive shield including a first metal line that encircles the first terminal in the first metallization structure level, the first metal line spaced apart from the first terminal by a gap distance in the first and second directions, and the gap distance being at least 0.5 μm and less than 1.0 μm;

separating a semiconductor die including the semiconductor layer and the multilevel metallization structure from a wafer;

forming an electrical connection to the second terminal of the capacitor; and enclosing the semiconductor die and the electrical connection in a package structure with conductive leads exposed along one or more sides of the package structure.

16. The method of claim 15, wherein the overlap distance is 2.0 μm to 5.0 μm.

17. The method of claim 15, wherein the gap distance is 0.55 μm to 0.75 μm.

18. The method of claim 15, wherein forming the multilevel metallization structure comprises:

forming a bilayer structure in one of the metallization structure levels, the bilayer structure having a silicon oxynitride layer and a silicon nitride layer on the silicon oxynitride layer, the second terminal on a portion of the silicon nitride layer; and forming a trench in the bilayer structure, the trench spaced laterally outward from the second terminal in the first and second directions, the trench extending through the silicon oxynitride layer along the third direction, the trench extending partially into the silicon oxynitride layer along the third direction, and the trench filled with dielectric material of the second metallization structure level.

19. An integrated circuit, comprising:

an upper capacitor plate in an upper metal level over a semiconductor substrate, and a lower capacitor plate in a lower metal level over semiconductor substrate, the upper capacitor plate overlapping the lower capacitor plate such that the lower capacitor plate completely extends laterally beyond the upper capacitor plate by an overlap distance in a range from 1.0 μm to 6.0 μm; and a ground ring in the lower metal level surrounding the lower capacitor plate, the ground ring and the lower capacitor plate being laterally spaced apart by a gap distance in a range from 0.5 μm to less than 1.0 μm.

20. The integrated circuit of claim 19, wherein the overlap distance is 2.0 μm to 5.0 μm.

21. The integrated circuit of claim 19, wherein the gap distance is 0.55 μm to 0.75 μm.

22. The integrated circuit of claim 21, wherein the overlap distance is 2.0 μm to 5.0.

23. The integrated circuit of claim 19, wherein the gap distance is about 0.55 μm and the overlap distance is about 3.0 μm.

24. The integrated circuit of claim 19, wherein the gap distance is 0.55 μm±0.25 μm and the overlap distance is about 3.0 μm±0.15 μm.

* * * * *